(12) United States Patent
Chiba et al.

(10) Patent No.: US 11,626,394 B2
(45) Date of Patent: Apr. 11, 2023

(54) SEMICONDUCTOR STORAGE DEVICE

(71) Applicant: Kioxia Corporation, Tokyo (JP)

(72) Inventors: Akihiko Chiba, Yokohama Kanagawa (JP); Takahiro Tsurudo, Yokohama Kanagawa (JP); Kenichi Matoba, Yokohama Kanagawa (JP); Yoshifumi Shimamura, Yokohama Kanagawa (JP); Hiroaki Nakasa, Yokohama Kanagawa (JP); Hiroyuki Takenaka, Kamakura Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 157 days.

(21) Appl. No.: 17/184,837

(22) Filed: Feb. 25, 2021

(65) Prior Publication Data

US 2022/0077128 A1    Mar. 10, 2022

(30) Foreign Application Priority Data

Sep. 4, 2020 (JP) .............................. JP2020-149193

(51) Int. Cl.
| | |
|---|---|
| *H01L 23/48* | (2006.01) |
| *H01L 25/18* | (2023.01) |
| *H01L 23/528* | (2006.01) |
| *H01L 23/00* | (2006.01) |

(52) U.S. Cl.
CPC .......... *H01L 25/18* (2013.01); *H01L 23/5286* (2013.01); *H01L 24/08* (2013.01); *H01L 2224/08145* (2013.01); *H01L 2924/14511* (2013.01)

(58) Field of Classification Search
None
See application file for complete search history.

(56) References Cited

U.S. PATENT DOCUMENTS

| | | | | |
|---|---|---|---|---|
| 9,136,249 | B2* | 9/2015 | Kim | ...................... H01L 23/481 |
| 9,201,777 | B2* | 12/2015 | Hsu | ........................ G06F 13/16 |
| 2015/0137875 | A1* | 5/2015 | Ko | ....................... H03K 17/687 |
| | | | | 257/369 |
| 2018/0130786 | A1* | 5/2018 | Deepak | ................. H01L 27/088 |
| 2019/0273090 | A1 | 9/2019 | Fukuzumi et al. | |

FOREIGN PATENT DOCUMENTS

JP     2010-062901 A    3/2010

\* cited by examiner

*Primary Examiner* — Hung K Vu
(74) *Attorney, Agent, or Firm* — Foley & Lardner LLP

(57) ABSTRACT

A semiconductor storage device includes a first semiconductor chip having a first bonding surface; and a second semiconductor chip having a second bonding surface, the second bonding surface being bonded to the first bonding surface. The first semiconductor chip includes a control circuit, a first power line connected to the control circuit and extending in a first direction, and a first pad electrode disposed on the first bonding surface. The second semiconductor chip includes a second power line extending in a second direction, a third power line connected to the second power line and extending in the first direction, a second pad electrode connected to the third power line, and a third pad electrode disposed on the second bonding surface.

7 Claims, 13 Drawing Sheets

SEMICONDUCTOR STORAGE DEVICE

CROSS-REFERENCE TO RELATED APPLICATION(S)

This application is based upon and claims the benefit of priority from Japanese Patent Application No. 2020-149193, filed Sep. 4, 2020, the entire contents of which are incorporated herein by reference.

FIELD

Embodiments described herein relate generally to a semiconductor storage device.

BACKGROUND

A memory device having a three dimensional structure has been proposed. In order to reduce a chip occupancy of a control circuit of a three dimensional memory cell array, a chip bonding array (CBA) technique has been proposed as a method of providing a control circuit directly under a three dimensional memory cell array. The control circuit is generally formed of a complementary metal oxide semiconductor (CMOS) circuit. In the CBA technology, a CMOS chip and a memory cell array chip are made on separate wafers and joined (bonded) by electrode pads. Therefore, a significant reduction in chip size can be achieved.

DETAILED DESCRIPTION

Figure 1:
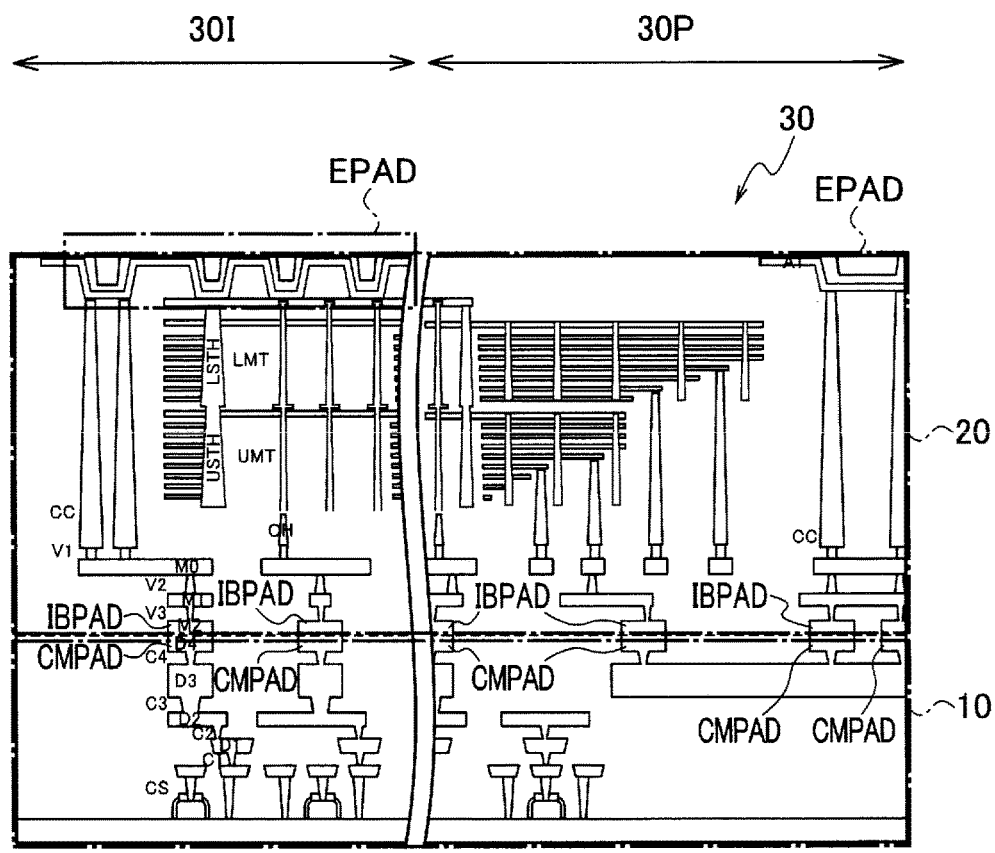
FIG. 1 a diagram schematically showing a cross-sectional structure of a semiconductor storage device according to a first embodiment.

A CMOS chip has numerous circuit groups and requires a plurality of power lines. The power lines of the CMOS chip require relatively thicker wiring in consideration of a current capacity. As wirings connected to the circuit groups of the CMOS chip other than the power lines, there are a plurality of wirings such as signal wirings. However, if there are thick power lines, it is necessary to connect the signal wirings or the like while avoiding the power lines, which may be subject to layout restrictions. As a result, a chip area of the CMOS chip may be increased due to the thick power lines and the signal wirings.

An object of the embodiment is to provide a semiconductor storage device in which a wiring region and a current density of signal lines in a CMOS chip bonded to a memory cell array chip are mitigated.

A semiconductor storage device according to one embodiment includes a first semiconductor chip having a first bonding surface extending along a first direction and a second direction orthogonal to the first direction; and a second semiconductor chip having a second bonding surface extending along the first direction and the second direction, the second bonding surface being bonded to the first bonding surface. The first semiconductor chip includes a control circuit, a first power line connected to the control circuit and extending in the first direction, and a first pad electrode disposed on the first bonding surface. The second semiconductor chip includes a second power line extending in the second direction, a third power line connected to the second power line and extending in the first direction, a second pad electrode connected to the third power line, and a third pad electrode disposed on the second bonding surface. The first power line and the second power line are bonded to each other through the first pad electrode and the third pad electrode, and the first power line is coupled to the second pad electrode via the third power line.

Next, embodiments will be described with reference to the drawings. In the description of the drawings described below, same or similar portions are denoted by same or similar reference numerals. The drawings are schematic. A connection also includes direct or indirect connections, e.g., where another conductive element is interposed in the connection.

The embodiments described below illustrate devices and methods for embodying technical ideas, and do not specify a material, a shape, a structure, an arrangement, and the like of each component. Various modifications may be made to the embodiments within a scope of claims.

First Embodiment

In the semiconductor storage device according to the embodiment, a device obtained by bonding devices to each other includes a wiring shape in which a part of wiring of one device is wired in another device.

The device obtained by bonding the devices to each other includes a wiring shape in which a trunk power line of the one device is wired in the other device.

The device obtained by bonding the devices to each other may include a wiring shape in which a signal line of the one device is wired in the other device.

The device obtained by bonding the devices to each other may include a wiring shape in which a part of wiring of the one device is wired in the other device and is connected via a pad electrode.

The device obtained by bonding the devices to each other may include a wiring shape in which a part of wiring of the one device is wired in the uppermost layer of the other device and is connected via the pad electrode.

In the above, the devices are, for example, a first circuit chip and a second circuit chip. The first circuit chip and the second circuit chip are each formed on separate wafers. The first circuit chip and the second circuit chip are bonded to each other in a flip chip manner.

The first circuit chip is, for example, a CMOS chip. The second circuit chip is, for example, a memory cell array chip. Hereinafter, a CMOS chip and a three dimensional (3D) memory cell array chip will be specifically described as an example.

FIG. 1 schematically shows a cross-sectional structure of a semiconductor storage device 30 according to the first embodiment. The semiconductor storage device 30 includes a CMOS chip 10 and a memory cell array chip 20. The CMOS chip 10 and the memory cell array chip 20 are bonded to each other. Pad electrodes CMPAD in the CMOS chip 10 are disposed at a bonding portion of the CMOS chip 10. Bonding pad electrodes IBPAD in the memory cell array chip 20 are disposed at a bonding portion of the memory cell array chip 20. The pad electrodes CMPAD and the bonding pad electrodes IBPAD are connected to each other.

The bonding pad electrodes IBPAD are pad electrodes connecting to the pad electrodes CMPAD of the CMOS chip 10. The pad electrodes CMPAD are pad electrodes for supplying power source and pad electrodes for supplying signals to the CMOS chip 10. Over the other side of the memory cell array chip 20, pad electrodes EPAD are disposed on a surface of the semiconductor storage device 30. The pad electrodes EPAD are pad electrodes for supplying power source and pad electrodes for supplying signals to the CMOS chip 10 and the memory cell array chip 20 from an outside.

The memory cell array chip 20 includes a 3D NAND flash memory cell array configuration. The memory cell array chip 20 includes a main region 30I and a peripheral region 30P. In the main region 30I, an upper memory cell group (UMT) and a lower memory cell group (LMT) having 3D configurations are stacked. The peripheral region 30P has a staircase structure in which an electrode can be easily taken out from a word line. The memory cell array chip 20 has a two-tier configuration including an upper portion tier (USTH) and a lower portion tier (LSTH). A memory cell array structure of the memory cell array chip 20 will be described later with reference to FIGS. 20 and 21.

(Electrode Structure of CMOS Chip)

Figure 2:
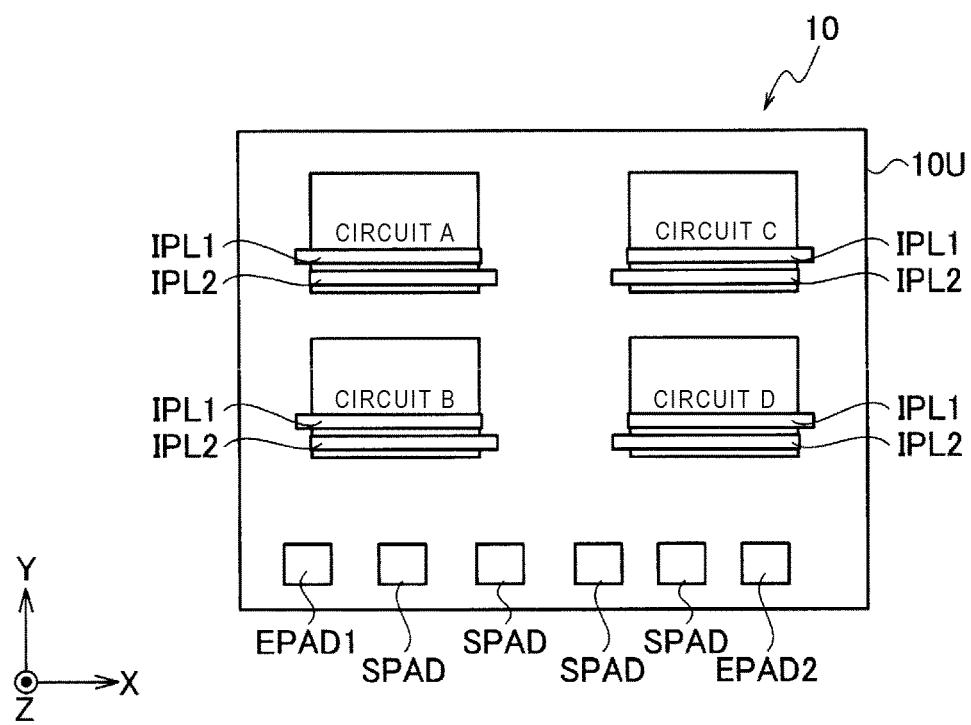
FIG. 2 is a plan view of an electrode structure of a bonding portion of a CMOS chip in the semiconductor storage device according to the first embodiment.

FIG. 2 is a plan view of an electrode structure of a bonding portion of the CMOS chip 10 in the semiconductor storage device 30 according to the first embodiment.

A plurality of CMOS circuits A to D, internal power lines IPL1 and IPL2 disposed on each of the CMOS circuits A to D, power source pad electrodes EPAD1 and EPAD2, and a plurality of signal pad electrodes SPAD are disposed on a bonding surface 10U of the CMOS chip 10. The power source pad electrodes EPAD1 and EPAD2 and the plurality of signal pad electrodes SPAD are disposed in a peripheral portion of the CMOS chip 10.

As shown in FIG. 2, the bonding surface 10U of the CMOS chip 10 is defined as an X-Y plane, a direction in which the internal power lines IPL1 and IPL2 extend is defined as an X direction, and a direction perpendicular to the X direction is defined as a Y direction. A direction perpendicular to the X-Y plane is defined as a Z direction.

In FIG. 2, the internal power lines IPL1 and IPL2 are a plurality of terminal power lines and/or ground lines distributed to the CMOS circuits A to D. The plurality of signal pad electrodes SPAD are pad electrodes connected to signal lines. In the 3D NAND flash memory, a high voltage different from a normal logic level voltage is used for a write voltage and an erase voltage. Therefore, it is necessary to supply various power source voltages including a ground voltage level to the CMOS chip 10. The power lines and the signal lines are disposed in accordance with such various voltage levels.

(Electrode Structure of Memory Cell Array Chip)

Figure 3:
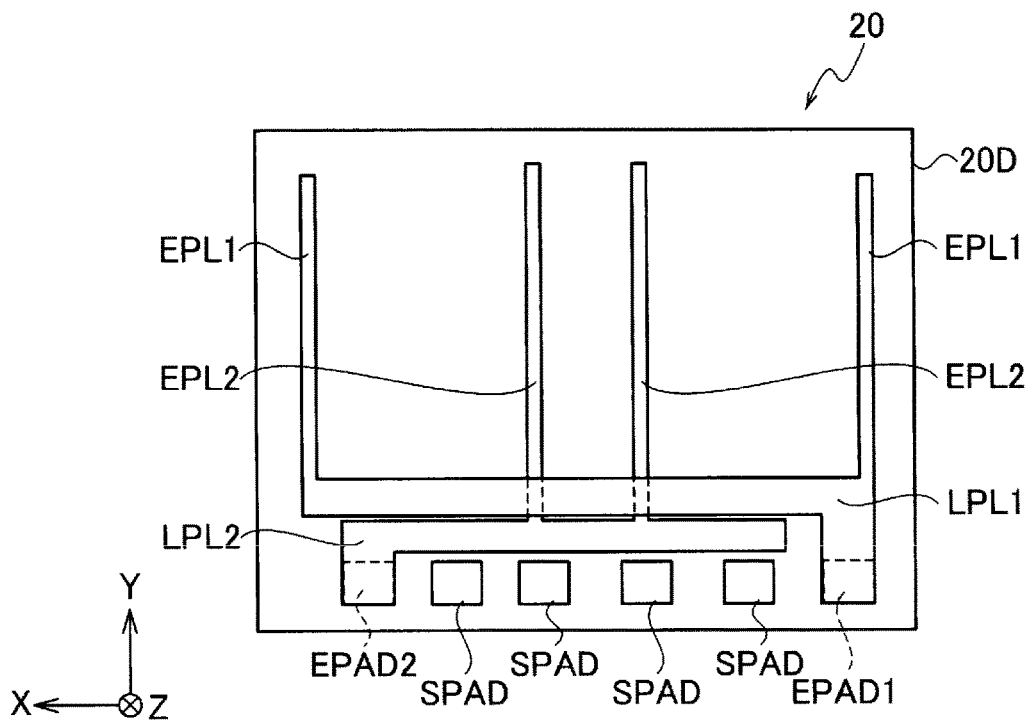
FIG. 3 is a plan view of an electrode structure of a bonding portion of a memory cell array chip in the semiconductor storage device according to the first embodiment.

FIG. 3 is a plan view of an electrode structure of the memory cell array chip 20 in the semiconductor storage device 30 according to the first embodiment. External power lines EPL1 and EPL2, trunk power lines LPL1 and LPL2, and a plurality of signal pad electrodes SPAD are disposed on a bonding surface 20D of the memory cell array chip 20. The power source pad electrodes EPAD1 and EPAD2 and the plurality of signal pad electrodes SPAD are disposed in a peripheral portion of the bonding surface 20D of the memory cell array chip 20. The trunk power line LPL1 is connected to the power source pad electrode EPAD1, and the trunk power line LPL2 is connected to the power source pad electrode EPAD2. The external power lines EPL1 and EPL2 and the trunk power lines LPL1 and LPL2 may be partially or wholly disposed in the memory cell array chip 20. The power source pad electrodes EPAD1 and EPAD2 are disposed on a surface on an opposite side of the bonding surface 10U of the memory cell array chip.

The external power lines EPL1 and EPL2 are power lines having a larger current capacity than the internal power lines IPL1 and IPL2. Further, the trunk power lines LPL1 and LPL2 are truck power lines having a larger current capacity than the external power lines EPL1 and EPL2.

As shown in FIG. 3, the bonding surface 20D of the memory cell array chip 20 corresponds to the X-Y plane. A direction in which the external power lines EPL1 and EPL2 extend is the Y direction, and a direction in which the trunk power lines LPL1 and LPL2 extend is the X direction.

(Electrode Structure of Bonding Portion of CMOS Chip and Memory Cell Array Chip)

Figure 4:
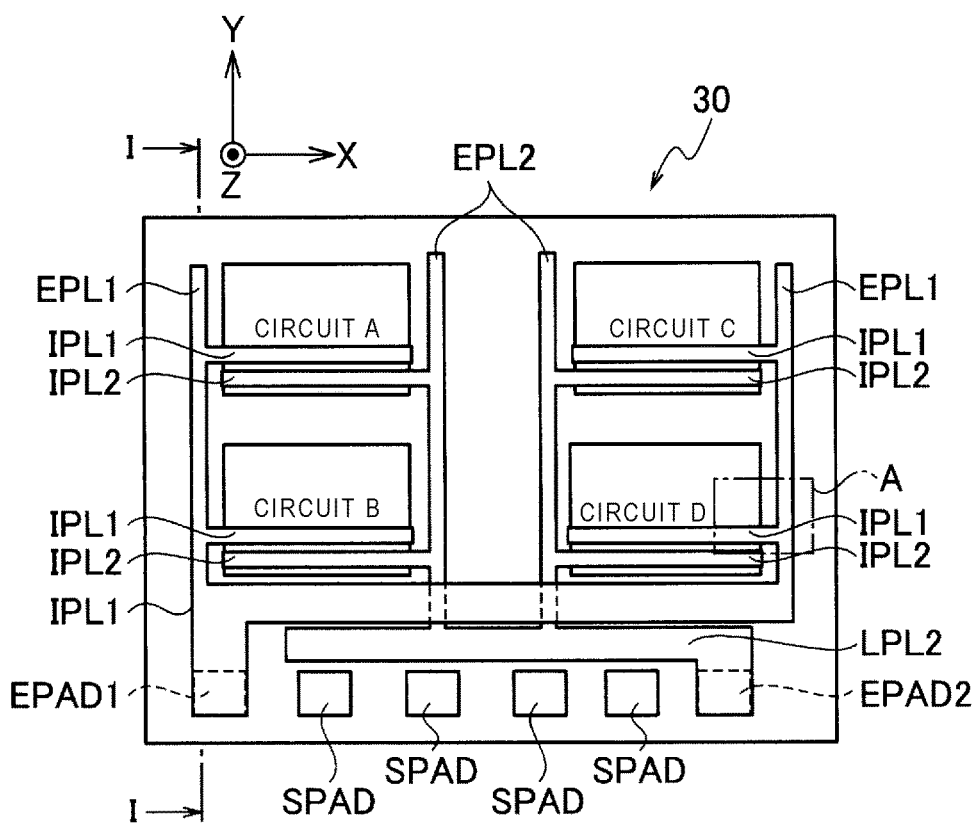
FIG. 4 is a plan view of an electrode structure of a bonding portion of the CMOS chip and the memory cell array chip in the semiconductor storage device according to the first embodiment.

FIG. 4 is a plan view of an electrode structure of a bonding portion after bonding the CMOS chip 10 and the memory cell array chip 20 in the semiconductor storage device according to the first embodiment. In FIG. 4, the memory cell array chip 20 is disposed on the CMOS chip 10 in the Z direction. The memory cell array chip 20 is disposed on the CMOS chip 10 in a flip chip manner. The bonding surface 20D of the memory cell array chip 20 is bonded and connected to the bonding surface 10U of the CMOS chip 10.

In a peripheral portion of the CMOS circuits A to D, each internal power line IPL1 is bonded to the external power line EPL1. Each internal power line IPL2 is connected to the external power line EPL2 by bonding. Details of the bonding will be described below with reference to FIG. 5.

Figure 5:
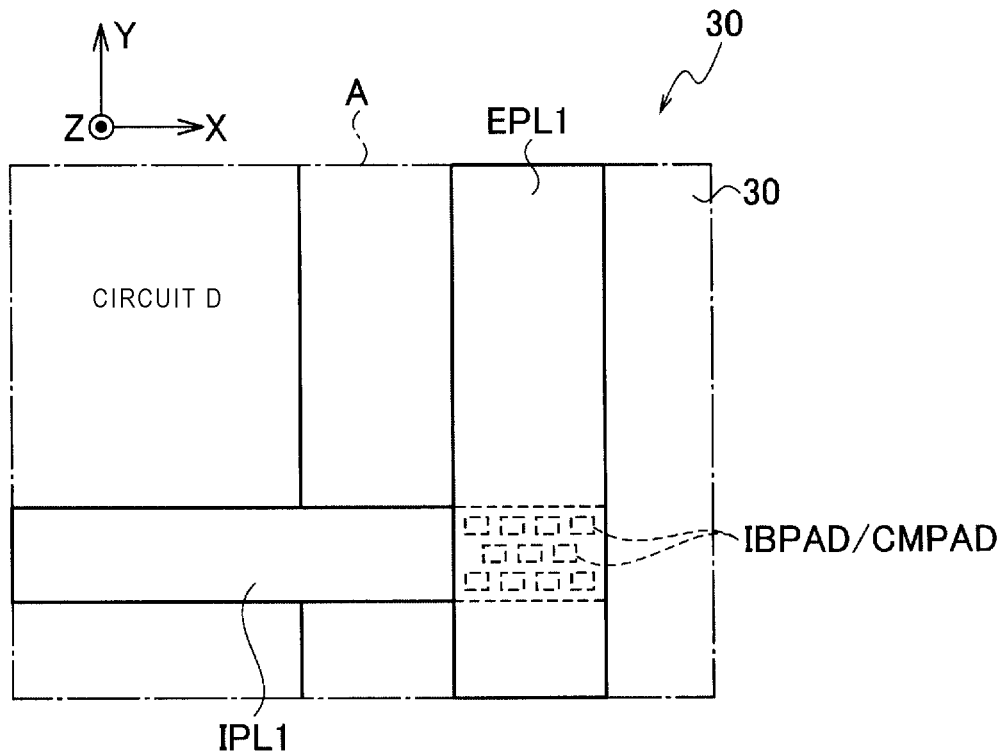
FIG. 5 is an enlarged plan view of a region A in FIG. 4.

FIG. 5 is an enlarged plan view of a region A in FIG. 4. The internal power line IPL1 is connected to the external power line EPL1 by bonding. At a bonding portion of the internal power line IPL1 and the external power line EPL1, the pad electrodes CMPAD are connected to the bonding pad electrodes IBPAD. As shown in FIG. 5, the bonding pad electrodes IBPAD and the pad electrodes CMPAD may be connected at a number of places. The pad electrodes CMPAD are disposed on the bonding surface 10U of the CMOS chip 10. The bonding pad electrodes IBPAD are disposed on the bonding surface 20D of the memory cell array chip 20.

The pad electrodes CMPAD of the CMOS chip are pad electrodes that are used for connecting to the memory cell array chip 20. The bonding pad electrodes IBPAD are pad electrodes that connect the CMOS chip and the memory cell array chip. The external power lines EPL1 and EPL2 are power lines and ground lines having a large current capacity. The external power line EPL2 is connected to EPAD1 or EPAD2 for power source/grounding, which are used for connecting the semiconductor storage device 30 and an external power source.

(Connection Structure of External Power Line EPL1 and Internal Power Line IPL1)

Figure 6:
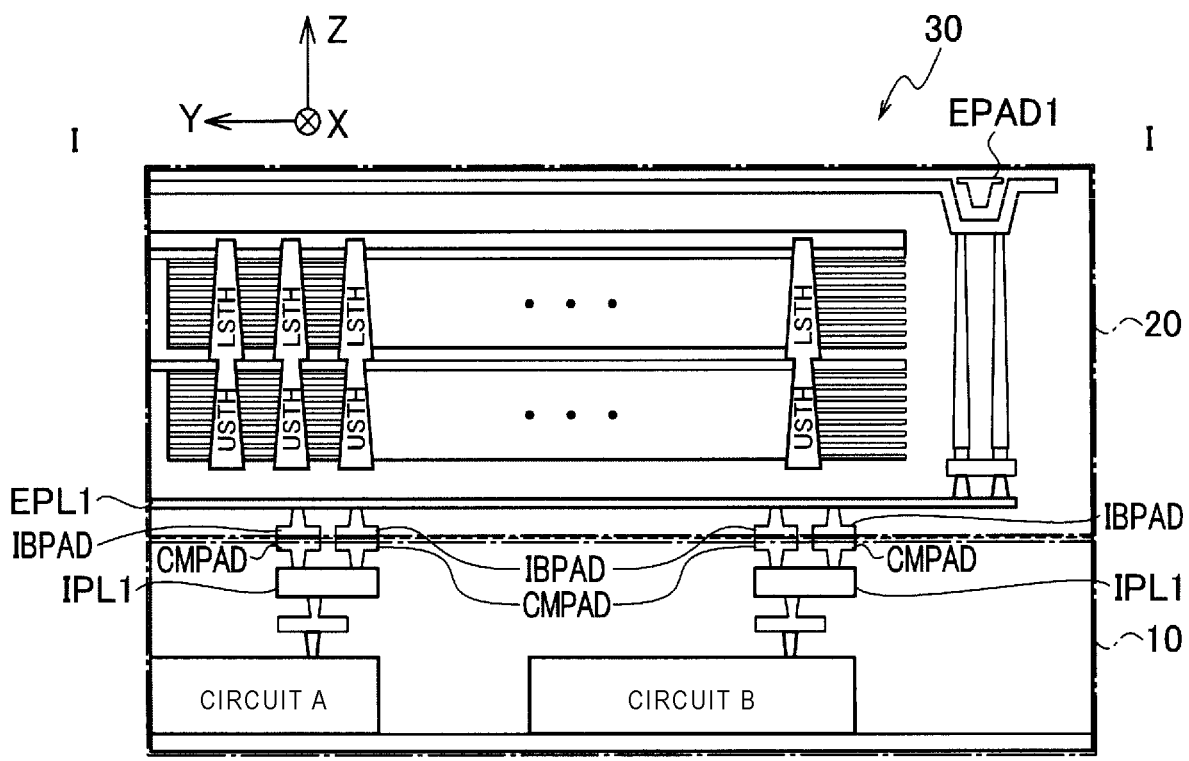
FIG. 6 is a cross-sectional view taken along a line I-I in FIG. 4.

FIG. 6 is a cross-sectional view taken along a line I-I in FIG. 4. As shown in FIG. 6, the CMOS chip 10 and the memory cell array chip 20 are stacked in the Z direction. The internal power line IPL1 connected to the CMOS circuit A extends in the X direction in the vicinity of the bonding portion of the CMOS chip 10. The internal power line IPL1 connected to the CMOS circuit B extends in the X direction. The external power line EPL1 extends in the Y direction in the vicinity of the bonding portion of the memory cell array chip 20.

The internal power line IPL1 connected to the CMOS circuit A is connected to the external power line EPL1 above the CMOS circuit A in the Z direction. The internal power line IPL1 connected to the CMOS circuit B is connected to the external power line EPL1 above the CMOS circuit B in the Z direction.

As shown in FIG. 6, at the bonding portion of the internal power line IPL1 and the external power line EPL1, the pad electrodes CMPAD are connected to the bonding pad electrodes IBPAD. As shown in FIG. 6, the pad electrodes CMPAD and the bonding pad electrodes IBPAD may be connected at a plurality of places. The pad electrodes CMPAD are disposed on the bonding surface 10U of the CMOS chip 10. The bonding pad electrodes IBPAD are disposed on the bonding surface 20D of the memory cell array chip 20.

As shown in FIG. 6, a terminal portion of the external power line EPL1 is connected to the power source pad electrode EPAD1. The power source pad electrode EPAD1 is disposed on a surface of the semiconductor storage device 30 (a surface opposite to the bonding surface 20D of the memory cell array chip 20) using a structure that penetrates the memory cell array chip 20. The power source pad electrode EPAD1 is a bonding pad. The power source pad electrode EPAD1 is disposed on the surface of the semiconductor storage device 30 in the peripheral portion of the memory cell array chip 20.

In the semiconductor storage device 30 according to the first embodiment, no trunk power lines are wired in the CMOS chip 10. The trunk power lines LPL1 and LPL2 are wired in the memory cell array chip 20. Further, the external power lines EPL1 and EPL2 and the internal power lines IPL1 and IPL2 of the CMOS chip 10 are connected via the bonding pad electrodes IBPAD and CMPAD.

In the semiconductor storage device according to the embodiment, in the memory cell array chip to be bonded, the trunk power lines drawn out from the pad electrode of the CMOS chip are connected by using a wiring layer of the memory cell array chip. The trunk power lines disposed in the memory cell array chip are connected by the bonding pad electrodes (the pad electrodes disposed inside the chip).

In the semiconductor storage device 30 according to the first embodiment, since the trunk power lines of the CMOS chip are wired in the memory cell array chip, a trunk power line region of the CMOS chip is omitted. Therefore, the trunk power line region of the CMOS chip can be set to a region for a wiring other than the power source (signal line).

According to the semiconductor storage device according to the embodiment, a wiring region and a current density of the signal lines in the CMOS chip bonded to the memory cell array chip can be mitigated.

Second Embodiment (Electrode Structure of CMOS Chip)

Figure 7:
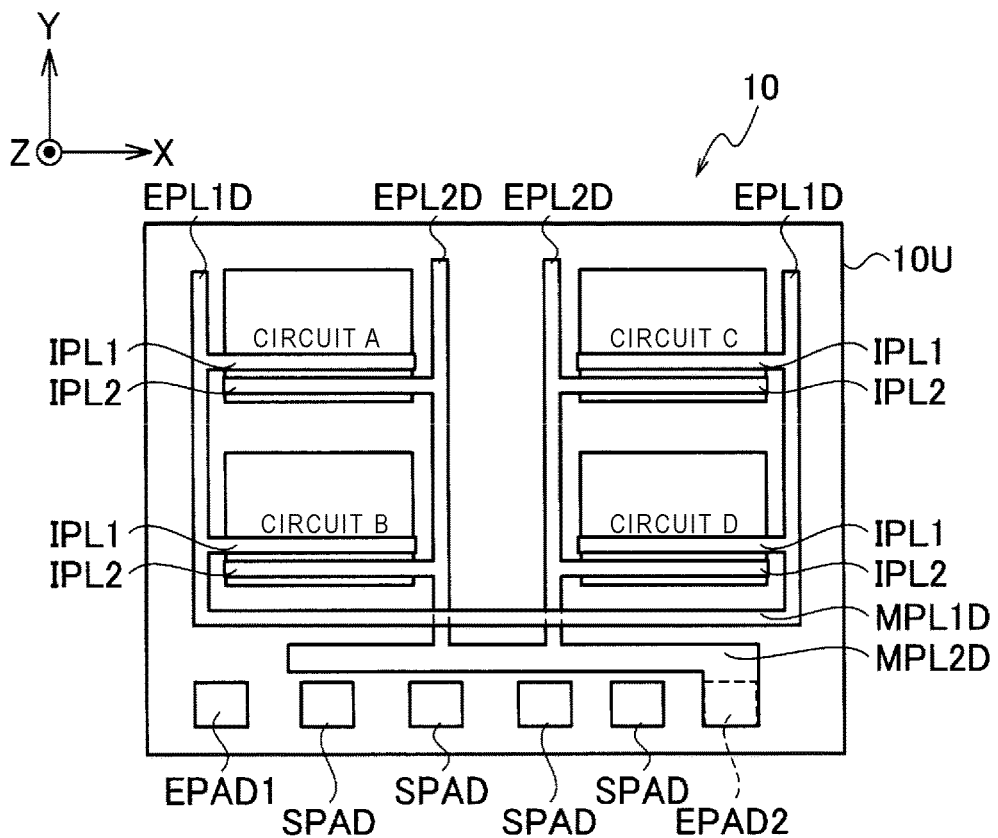
FIG. 7 is a plan view of an electrode structure of the bonding portion of the CMOS chip in the semiconductor storage device according to a second embodiment.

FIG. 7 is a plan view of an electrode structure of the CMOS chip 10 in the semiconductor storage device 30 according to the second embodiment.

The plurality of CMOS circuits A to D, the internal power lines IPL1 and IPL2 disposed on each of the CMOS circuits A to D, external power lines EPL1D and EPL2D, and trunk power lines MPL1D and MPL2D are disposed on the CMOS chip 10. Also, the plurality of signal pad electrodes SPAD are disposed on the bonding surface 10U of the CMOS chip 10. The external power line EPL1D is connected to the internal power lines IPL1. The external power line EPL2 is connected to the internal power lines IPL2. The power source pad electrodes EPAD1 and EPAD2 and the plurality of signal pad electrodes SPAD are disposed in a peripheral portion of the bonding surface 10U of the CMOS chip 10. The power source pad electrodes EPAD1 and EPAD2 are disposed on the surface on the opposite side of the bonding surface 10U of the memory cell array chip.

As shown in FIG. 7, the bonding surface 10U of the CMOS chip 10 is set as the X-Y plane, the direction in which the internal power lines IPL1 and IPL2 extend is set as the X direction, and the direction perpendicular to the X direction is set as the Y direction. The direction perpendicular to the X-Y plane is set as the Z direction.

The trunk power line MPL1D is connected to the external power line EPL1D. The trunk power line MPL2D is connected to the external power line EPL2D.

(Electrode Structure of Memory Cell Array Chip)

Figure 8:
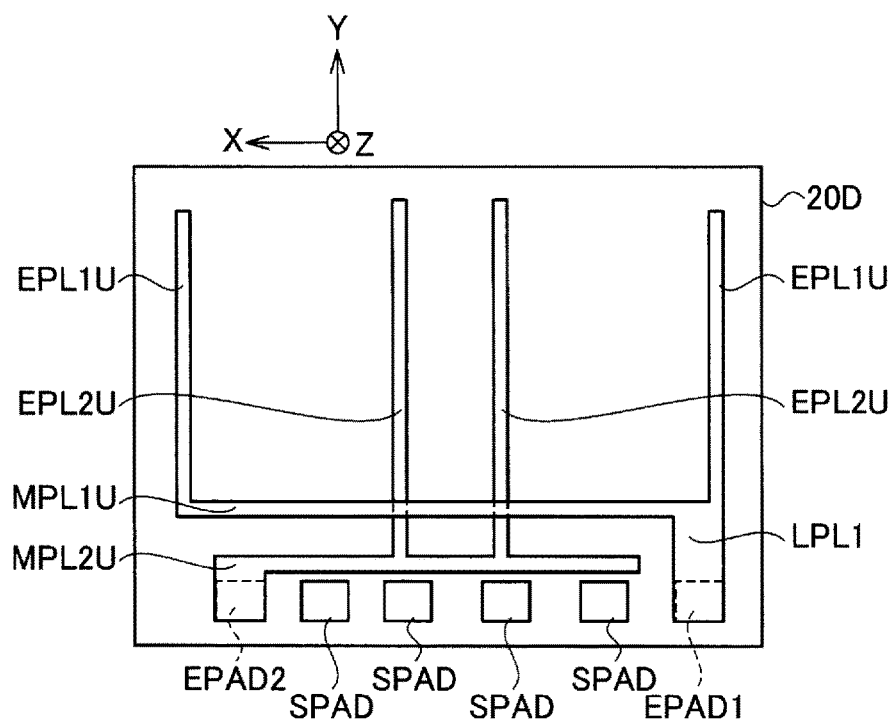
FIG. 8 is a plan view of an electrode structure of the bonding portion of the memory cell array chip in the semiconductor storage device according to the second embodiment.

FIG. 8 is a plan view of an electrode structure of the memory cell array chip 20 in the semiconductor storage device 30 according to the second embodiment. External power lines EPL1U and EPL2U, trunk power lines MPL1U and MPL2U, the power source pad electrodes EPAD1 and EPAD2, and the plurality of signal pad electrodes SPAD are disposed on the bonding surface 20D of the memory cell array chip 20. The power source pad electrodes EPAD1 and EPAD2 and the plurality of signal pad electrodes SPAD are disposed in the peripheral portion of the bonding surface 20D of the memory cell array chip 20. The trunk power line MPL1U is connected to the power source pad electrode EPAD1, and the trunk power line MPL2U is connected to the power source pad electrode EPAD2.

The external power lines EPL1U and EPL2U are power lines having a larger current capacity than the internal power lines IPL1 and IPL2. The trunk power lines MPL1U and MPL2U are truck power lines having a larger current capacity than the external power lines EPL1U and EPL2U.

As shown in FIG. 8, the bonding surface 20D of the memory cell array chip 20 corresponds to the X-Y plane. A direction in which the external power lines EPL1U and EPL2U extend is the Y direction, and a direction in which the trunk power lines MPL1U and MPL2U extend is the X direction.

(Electrode Structure of Bonding Portion of CMOS Chip and Memory Cell Array Chip)

Figure 9:
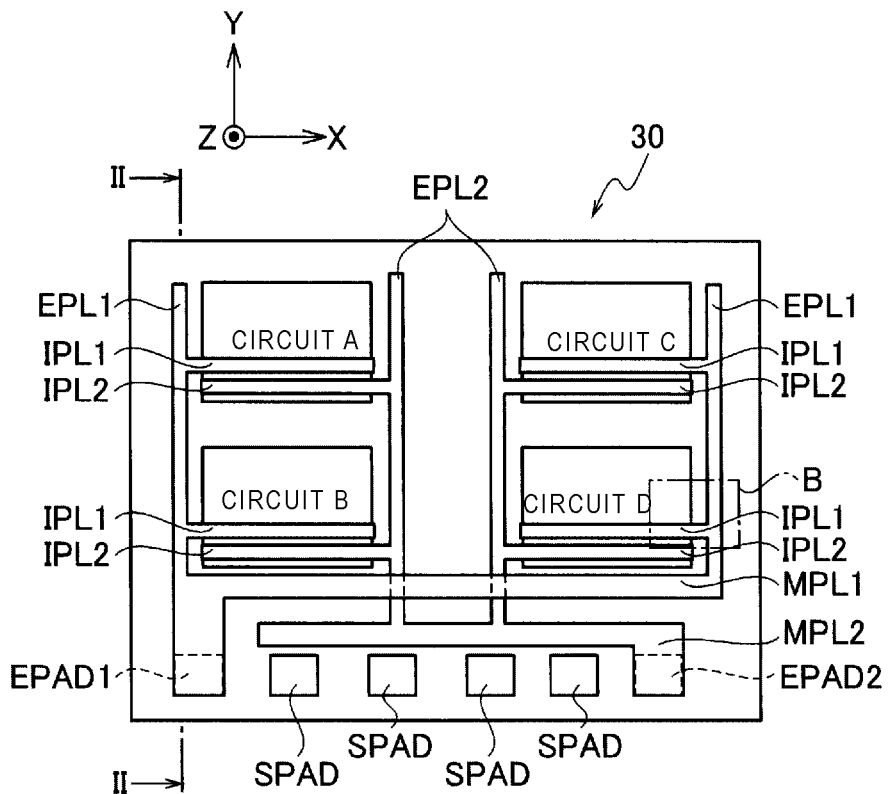
FIG. 9 is a plan view of an electrode structure of the bonding portion of the CMOS chip and the memory cell array chip in the semiconductor storage device according to the second embodiment.

FIG. 9 is a plan view of an electrode structure of the bonding portion after bonding the CMOS chip 10 and the memory cell array chip 20 in the semiconductor storage device according to the second embodiment. In FIG. 9, the memory cell array chip 20 is disposed on the CMOS chip 10 in the Z direction. The memory cell array chip 20 is bonded to the CMOS chip 10 in a flip chip manner. The bonding surface 20D of the memory cell array chip 20 is bonded and connected to the bonding surface 10U of the CMOS chip 10.

In a peripheral portion of the CMOS circuits A to D, each internal power line IPL1 is connected to the external power line EPL1. Each internal power line IPL2 is connected to the external power line EPL2. The trunk power line MPL1U is connected to the trunk power line MPL1D, and the trunk power line MPL2U is connected to the trunk power line MPL2D. The trunk power line MPL1U and the trunk power line MPL1D are connected to form a trunk power line MPL1. The trunk power line MPL2U and the trunk power line MPL2D are connected to form a trunk power line MPL2. The trunk power lines MPL1 and MPL2 are truck power lines having a large current capacity.

Figure 10:
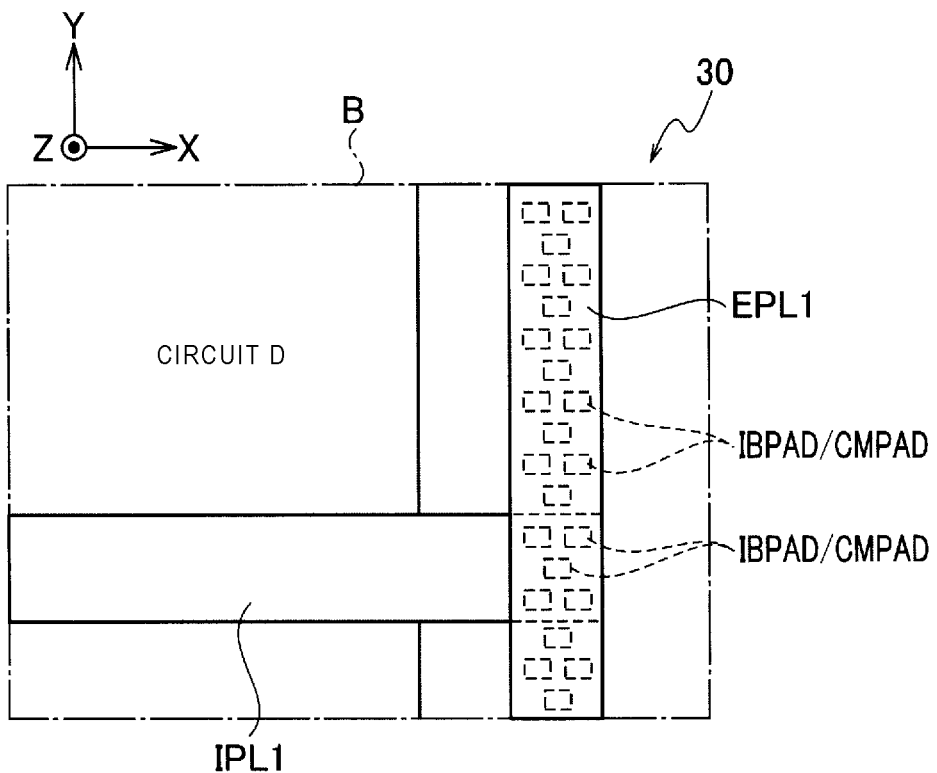
FIG. 10 is an enlarged plan view of a region B in FIG. 9.

FIG. 10 is an enlarged plan view of a region B in FIG. 9. The internal power line IPL1 is connected to the external power line EPL1. At the bonding portion of the internal power line IPL1 and the external power line EPL1, the pad electrodes CMPAD are connected to the bonding pad electrodes IBPAD. As shown in FIG. 10, the pad electrodes CMPAD and the bonding pad electrodes IBPAD may be connected at a plurality of places. The pad electrodes CMPAD are disposed on the bonding surface 10U of the CMOS chip 10. The bonding pad electrodes IBPAD are disposed on the bonding surface 20D of the memory cell array chip 20. The bonding pad electrodes IBPAD and the pad electrodes CMPAD are arranged in a staggered pattern as shown in FIG. 10. Alternatively, the electrodes may be arranged in a row in other examples.

(Connection Structure of External Power Line EPL1U and External Power Line EPL1D)

Figure 11:
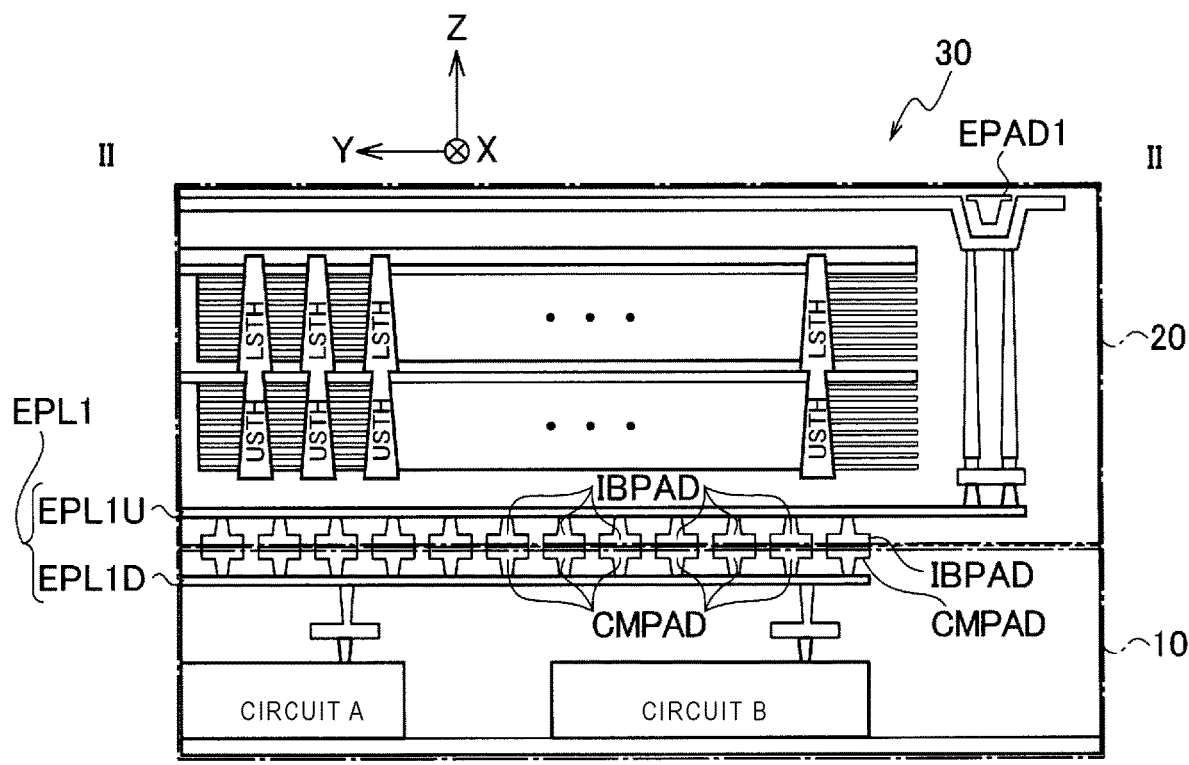
FIG. 11 is a cross-sectional view taken along a line II-II in FIG. 9.

FIG. 11 is a cross-sectional view taken along a line II-II in FIG. 9. As shown in FIG. 11, the memory cell array chip 20 is stacked on the CMOS chip 10 in the Z direction.

The external power line EPL1D connected to the CMOS circuit A and the CMOS circuit B extends in the Y direction in the vicinity of the bonding portion of the CMOS chip 10. The external power line EPL1U extends in the Y direction in the vicinity of the bonding portion of the memory cell array chip 20. The external power line EPL1D and the external power line EPL1U are connected to each other by the plurality of pad electrodes CMPAD and the plurality of bonding pad electrodes IBPAD. As a result, the external power line EPL1 is formed by the external power line EPL1D and the external power line EPL1U.

Although not shown, similar as in FIG. 6, the internal power line IPL1 connected to the CMOS circuit A extends in the X direction in the vicinity of the bonding portion of the CMOS chip 10. The internal power line IPL1 connected to the CMOS circuit B extends in the X direction. The internal power line IPL1 is connected to the external power line EPL1D above the CMOS circuit A in the Z direction. The internal power line IPL1 is connected to the external power line EPL1D above the CMOS circuit B in the Z direction.

As shown in FIG. 11, a terminal portion of the external power line EPL1U is connected to the power source pad electrode EPAD1. The power source pad electrode EPAD1 is disposed on the surface of the semiconductor storage device 30 using a structure that penetrates the memory cell array chip 20.

In the semiconductor storage device 30 according to the second embodiment, the trunk power lines MPL1D and MPL2D are wired in the CMOS chip 10. The trunk power lines MPL1U and MPL2U are also wired in the memory cell array chip 20. Also, on the chips, the trunk power lines MPL1U and MPL2U and the trunk power lines MPL1D and MPL2D are connected to each other via the bonding pad electrodes IBPAD and the pad electrodes CMPAD, respectively. The trunk power lines MPL1D and MPL2D are connected to the external power lines EPL1 and EPL2, and the internal power lines IPL1 and IPL2 of the CMOS chip 10 via the bonding pad electrodes IBPAD and the pad electrodes CMPAD.

In the semiconductor storage device 30 according to the second embodiment, even if the trunk power lines MPL1U and MPL2U of the CMOS chip 10 are thinly formed, a resistance of the trunk power lines MPL1 and MPL2 can be lowered by forming and connecting the trunk power lines MPL1D and MPL2D in the memory cell array chip 20 in a similar manner.

Third Embodiment (Electrode Structure of CMOS Chip)

Figure 12:
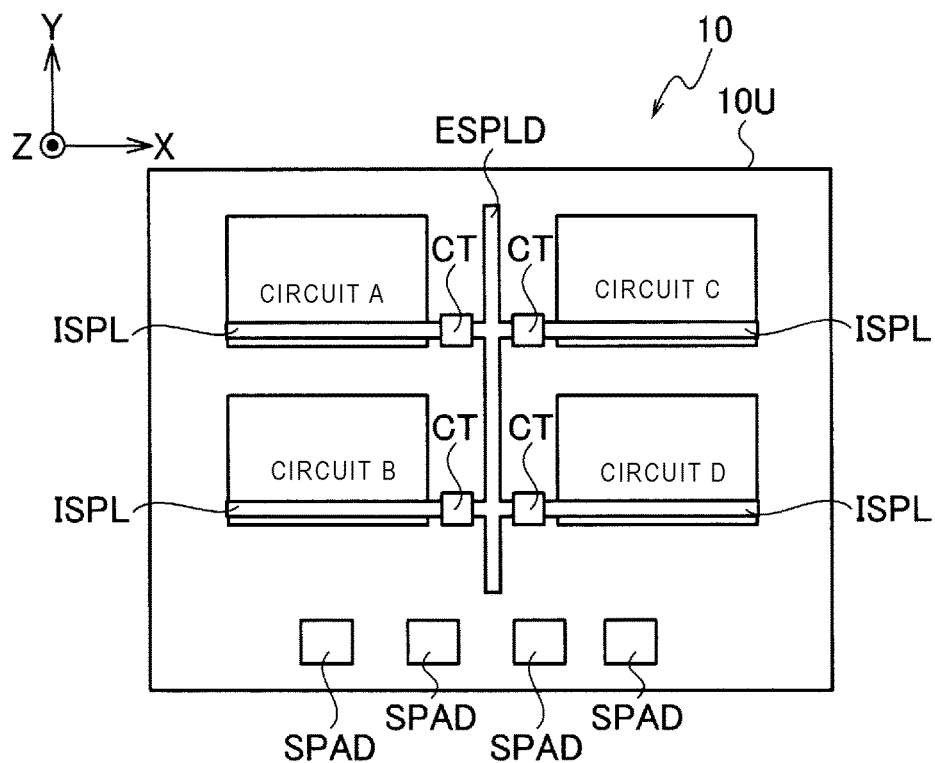
FIG. 12 is a plan view of an electrode structure of the bonding portion of the CMOS chip in the semiconductor storage device according to a third embodiment.

FIG. 12 is a plan view of an electrode structure of the CMOS chip 10 in the semiconductor storage device 30 according to the third embodiment. The plurality of CMOS circuits A to D, an internal signal line ISPL disposed on each of the CMOS circuits A to D, an external signal line ESPLD, and control circuits CT disposed between the external signal line ESPLD and each internal signal line ISPL are disposed on the CMOS chip 10. Also, the plurality of signal pad electrodes SPAD are disposed on the bonding surface of the CMOS chip 10. The control circuits CT are controlled by an external signal propagating in the external signal line ESPLD. An output signal of each control circuit CT is output to each internal signal line ISPL. Each control circuit CT functions as a buffer circuit. The output signal of each control circuit CT is, for example, a clock gate signal. The CMOS circuits A to D are controlled by the clock gate signal propagating to each internal signal line ISPL. In this case, the external signal line ESPLD and the internal signal lines ISPL are clock wiring. The control circuit CT may include a gated clock circuit for driving the CMOS circuits A to D, respectively. Each control circuit CT is provided between the external signal line ESPLD and each internal signal line ISPL. Alternatively, each control circuit CT may be provided inside each of the CMOS circuits A to D.

The plurality of signal pad electrodes SPAD are disposed in a peripheral portion of the bonding surface 10U of the CMOS chip 10. The plurality of signal pad electrodes SPAD are pad electrodes connected to the signal lines.

As shown in FIG. 12, the bonding surface 10U of the CMOS chip 10 is set as the X-Y plane, the direction in which the internal signal lines ISPL extend is set as the X direction, and the direction perpendicular to the X direction is set as the Y direction. The direction perpendicular to the X-Y plane is set as the Z direction.

The external signal line ESPLD shown in FIG. 12 is a wiring has a particular current capacity. The reason is for distributing the signals to the internal signal lines ISPL connected to the plurality of CMOS circuits A to D. The internal signal lines ISPL are also wirings that are strict in terms of current capacity. Therefore, for example, each control circuit CT that functions as a buffer is provided between the external signal line ESPLD and each internal signal line ISPL.

(Electrode Structure of Memory Cell Array Chip)

Figure 13:
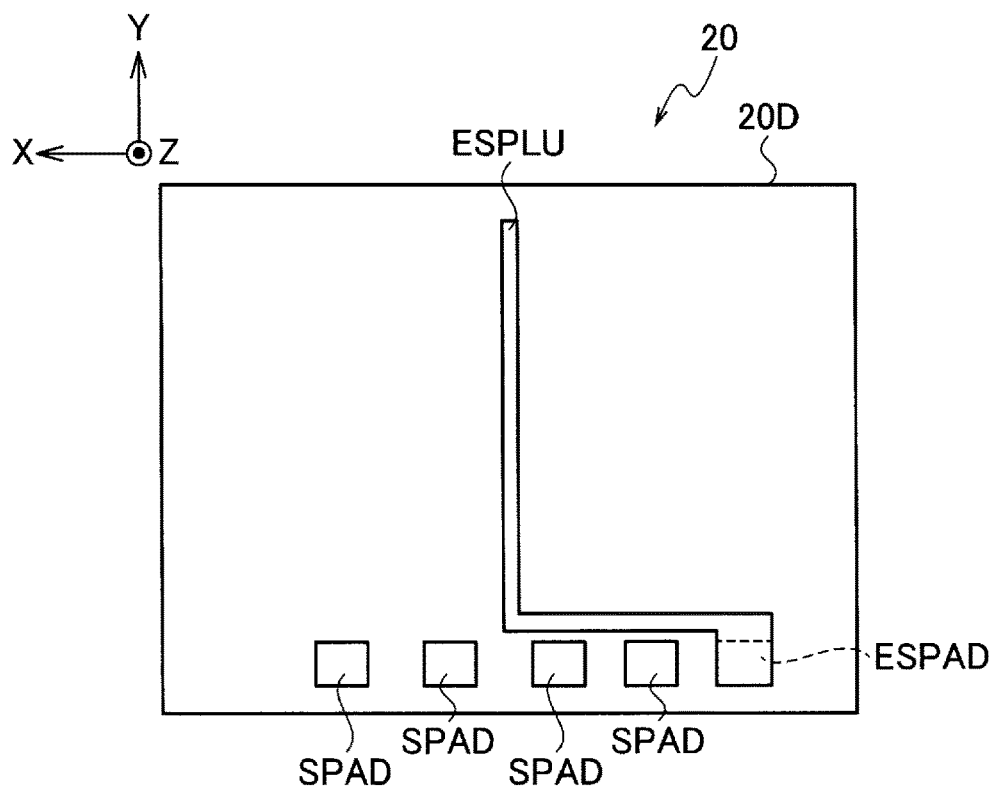
FIG. 13 is a plan view of an electrode structure of the memory cell array chip in the semiconductor storage device according to the third embodiment.

FIG. 13 is a plan view of an electrode structure of the memory cell array chip 20 in the semiconductor storage device 30 according to the third embodiment. An external signal line ESPLU, a signal pad electrode ESPAD, and the plurality of signal pad electrodes SPAD are disposed on the bonding surface 20D of the memory cell array chip 20. The signal pad electrode ESPAD and the plurality of signal pad electrodes SPAD are disposed in the peripheral portion of the bonding surface 20D of the memory cell array chip 20. The signal pad electrode ESPAD is connected to the external signal line ESPLU. A clock signal can be externally input to the external signal line ESPLU via the signal pad electrode ESPAD.

(Electrode Structure of Bonding Portion of CMOS Chip and Memory Cell Array Chip)

Figure 14:
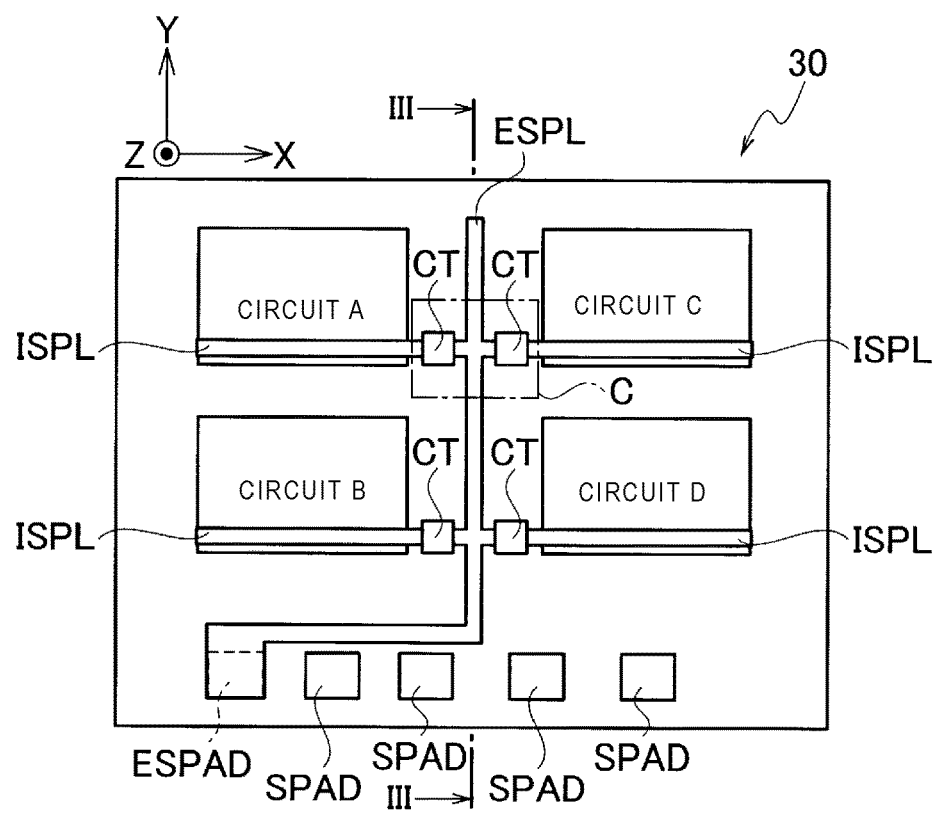
FIG. 14 is a plan view of an electrode structure of the bonding portion of the CMOS chip and the memory cell array chip in the semiconductor storage device according to the third embodiment.

FIG. 14 is a plan view of an electrode structure of the bonding portion after bonding the CMOS chip 10 and the memory cell array chip 20 in the semiconductor storage device 30 according to the third embodiment. In FIG. 14, the memory cell array chip 20 is disposed on the CMOS chip 10 in the Z direction. The memory cell array chip 20 is bonded to the CMOS chip 10 in a flip chip manner. The bonding surface 20D of the memory cell array chip 20 is connected to the bonding surface 10U of the CMOS chip 10.

Figure 15:
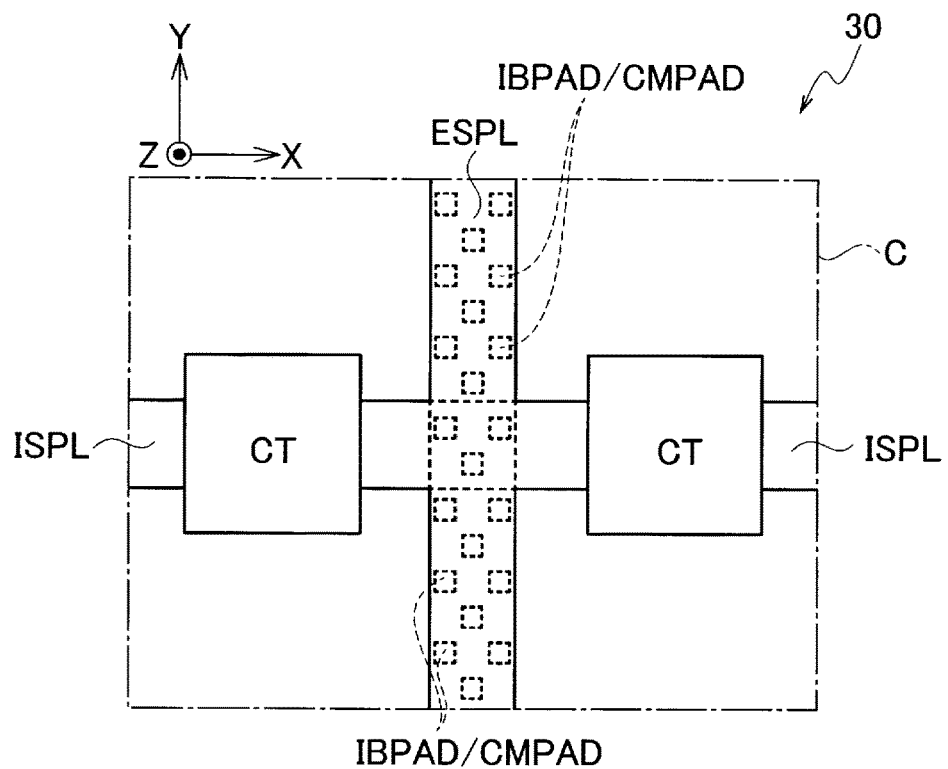
FIG. 15 is an enlarged plan view of a region C in FIG. 14.

FIG. 15 is an enlarged plan view of a region C in FIG. 14. The internal signal lines ISPL are connected to an external signal line ESPL. At a bonding portion of the internal signal lines ISPL and the external signal line ESPL, the pad electrodes CMPAD are connected to the bonding pad electrodes IBPAD. As shown in FIG. 15, the bonding pad electrodes IBPAD and the pad electrodes CMPAD may be connected at a plurality of places. The pad electrodes CMPAD are disposed on the bonding surface 10U of the CMOS chip 10. The bonding pad electrodes IBPAD are disposed on the bonding surface 20D of the memory cell array chip 20. The bonding pad electrodes IBPAD and the pad electrodes CMPAD may be arranged in a row. Such bonding pad electrodes IBPAD and pad electrodes CMPAD can be effectively disposed in a place where the signal lines are dense in terms of layout. Since wirings of a sense amplifier circuit that senses the memory cell, a sense amplifier module, and the like are dense, the wirings can be effectively disposed in such a signal line.

(Connection Structure of External Signal Line ESPLU and External Signal Line ESPLD)

Figure 16:
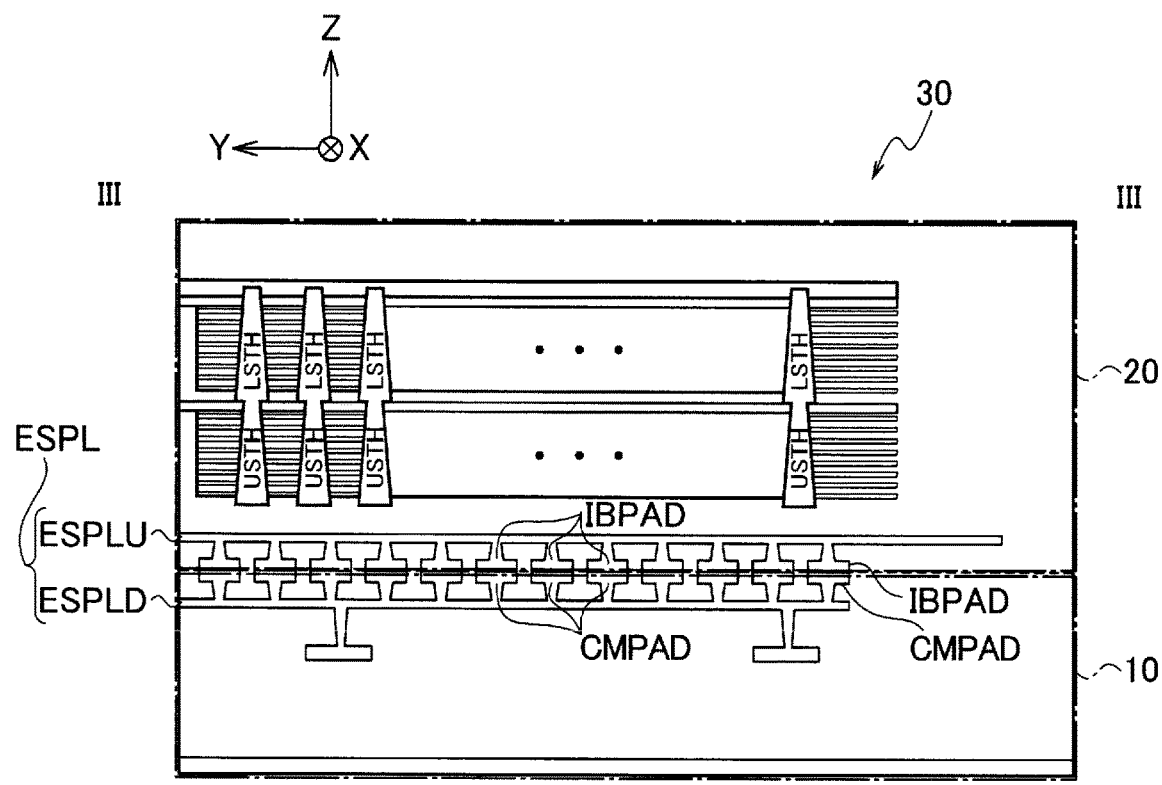
FIG. 16 is a cross-sectional view taken along a line III-III in FIG. 14.

FIG. 16 is a cross-sectional view taken along a line III-III in FIG. 14. In the peripheral portion of the CMOS circuits A to D, the external signal line ESPLD is connected to the external signal line ESPLU.

The external signal line ESPLD extends in the Y direction in the vicinity of the bonding portion of the CMOS chip 10. The external signal line ESPLU extends in the Y direction in the vicinity of the bonding portion of the memory cell array chip 20. The external signal line ESPLD and the external signal line ESPLU are connected by the plurality of pad electrodes CMPAD and the plurality of bonding pad electrodes IBPAD and form the external signal line ESPL.

In the semiconductor storage device according to the third embodiment, in contrast to the external signal line ESPLD that is strict in terms of current capacity in the CMOS chip 10, as shown in FIG. 16, the external signal line ESPL can be multi-layered in the CMOS chip 10 and the memory cell array chip 20, and thereby the current capacity is mitigated. Such a multi-layered structure of signal lines can also be applied to word lines and bit lines of the memory cell array chip 20. Such a multi-layered structure of signal lines can be effectively applied to signal lines with dense wirings such as a sense amplifier circuit and a sense amplifier module. The plurality of pad electrodes CMPAD and the plurality of bonding pad electrodes IBPAD may be arranged in a row, and may be arranged in, for example, a staggered pattern.

According to the semiconductor storage device according to the third embodiment, in terms of the signal lines in the CMOS chip 10, by partially wiring in the memory cell array chip 20 and connecting the wirings to each other via the bonding pad electrodes IBPAD, the wiring region and the current density of the signal lines in the CMOS chip 10 can be mitigated.

According to the semiconductor storage device according to the third embodiment, by wiring a signal that is strict in terms of current capacity to the memory cell array chip 20 and the CMOS chip 10, a wiring resistance can be lowered, and the current capacity of the wiring in the CMOS chip 10 can be mitigated.

As described above, in the semiconductor storage device according to the embodiment, in the memory device in which the CMOS chip and the memory cell array chip are bonded, by wiring the power line and the wirings of the CMOS chip in a memory cell array chip side and connecting the CMOS chip and the memory cell array chip at the bonding portion, the wirings of the CMOS chip can be effectively mitigated and the current density can be effectively reduced. Since a part of the wiring originally in the CMOS chip is wired in the memory cell array chip, the wiring region of the CMOS chip is mitigated by an amount of routing a wiring that was originally in the CMOS chip in the memory cell array chip.

(Memory System)

Figure 17:
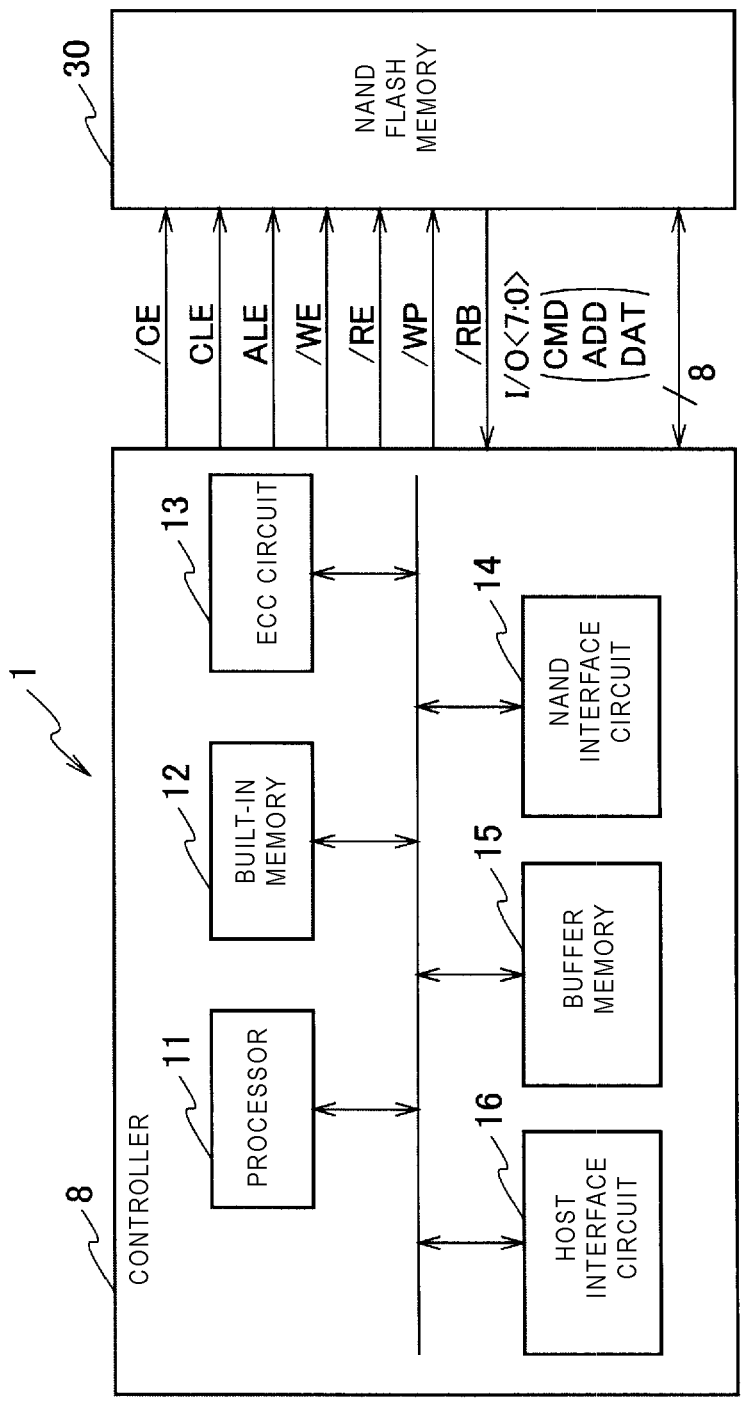
FIG. 17 is a diagram showing a block configuration example of a memory system applied to the semiconductor storage device according to an embodiment.

FIG. 17 shows a block configuration example of a memory system 1 applied with the semiconductor storage device 30 according to an embodiment. The memory system 1 communicates with, for example, an external host device. The memory system 1 stores data from the host device (not shown), and reads data to the host device.

As shown in FIG. 17, the memory system 1 includes a controller 8 and a semiconductor storage device (NAND flash memory) 30. The controller 8 receives a command from the host device and controls the semiconductor storage device 30 based on the received command. Specifically, the controller 8 writes data instructed from the host device to be written into the semiconductor storage device 30, and reads data instructed from the host device to be read from the semiconductor storage device 30 and transmits the read data to the host device. The controller 8 is connected to the semiconductor storage device 30 by a NAND bus. The semiconductor storage device 30 includes a plurality of memory cells and stores data in a nonvolatile manner.

The NAND bus transmits and receives signals /CE, CLE, ALE, /WE, /RE, /WP, /RB, and I/O <7:0> via individual wirings according to a NAND interface. The signal/CE is a signal for enabling the semiconductor storage device 30. The signal CLE notifies the semiconductor storage device 30 that the signal I/O <7:0> flowing through the semiconductor storage device 30 is a command while the signal CLE is at an H (High) level. The signal ALE notifies the semiconductor storage device 30 that the signal I/O <7:0> flowing through the semiconductor storage device 30 is an address while the signal ALE is at an H (High) level. The signal/WE instructs the semiconductor storage device 30 to capture the signal I/O <7:0> flowing through the semiconductor storage device 30 while the signal/WE is at an L (Low) level. The signal/RE instructs the semiconductor storage device 30 to output the signal I/O <7:0> to the semiconductor storage device 30. The signal/WP instructs the semiconductor storage device 30 to prohibit data writing and erasing. The signal/RB indicates whether the semiconductor storage device 30 is in a ready state (a state to receive an instruction from the outside) or a busy state (a state not to receive an instruction from the outside). The signal I/O <7:0> is, for example, an 8-bit signal. The signal I/O <7:0> is data transmitted and received between the semiconductor storage device 30 and the controller 8, and includes a command CMD, an address ADD, and data DAT. The data DAT includes write data and read data.

As shown in FIG. 17, the controller 8 includes a processor (central processing unit: CPU) 11, a built-in memory (random access memory: RAM) 12, an error check and correction (ECC) circuit 13, an NAND interface circuit 14, a buffer memory 15, and a host interface circuit 16.

The processor 11 controls operations of the entire controller 8. For example, in response to a data read command received from the host device, the processor 11 issues a read command based on the NAND interface to the semiconductor storage device 30. This operation is similar in a case of writing and erasing. The processor 11 has a function of performing various calculations on data read from the semiconductor storage device 30.

The built-in memory 12 is, for example, a semiconductor memory such as a dynamic RAM (DRAM), and is used as a work region of the processor 11. The built-in memory 12 stores firmware for managing the semiconductor storage device 30, various management tables, and the like.

The ECC circuit 13 performs an error detection and an error correction process. More specifically, when writing data, an ECC code is generated for each set of a certain number of data based on the data received from the host device. When reading data, ECC decoding is performed based on the ECC code to detect presence or absence of an error. Then, when an error is detected, a bit position thereof is specified, and the error is corrected.

The NAND interface circuit 14 is connected with the semiconductor storage device 30 via a NAND bus and controls communication with the semiconductor storage device 30. The NAND interface circuit 14 transmits the command CMD, the address ADD, and the write data to the semiconductor storage device 30 according to an instruction from the processor 11. The NAND interface circuit 14 receives the read data from the semiconductor storage device 30.

The buffer memory 15 temporarily stores data and the like received by the controller 8 from the semiconductor storage device 30 and the host device. The buffer memory 15 is also used, for example, as a storage region for temporarily storing the read data from the semiconductor storage device 30, calculation results for the read data, and the like.

The host interface circuit 16 is connected to the host device, and controls communication to the host device. The host interface circuit 16 respectively transfers, for example, a command and data received from the host device to the processor 11 and the buffer memory 15.

(Configuration of Semiconductor Storage Device)

Figure 18:
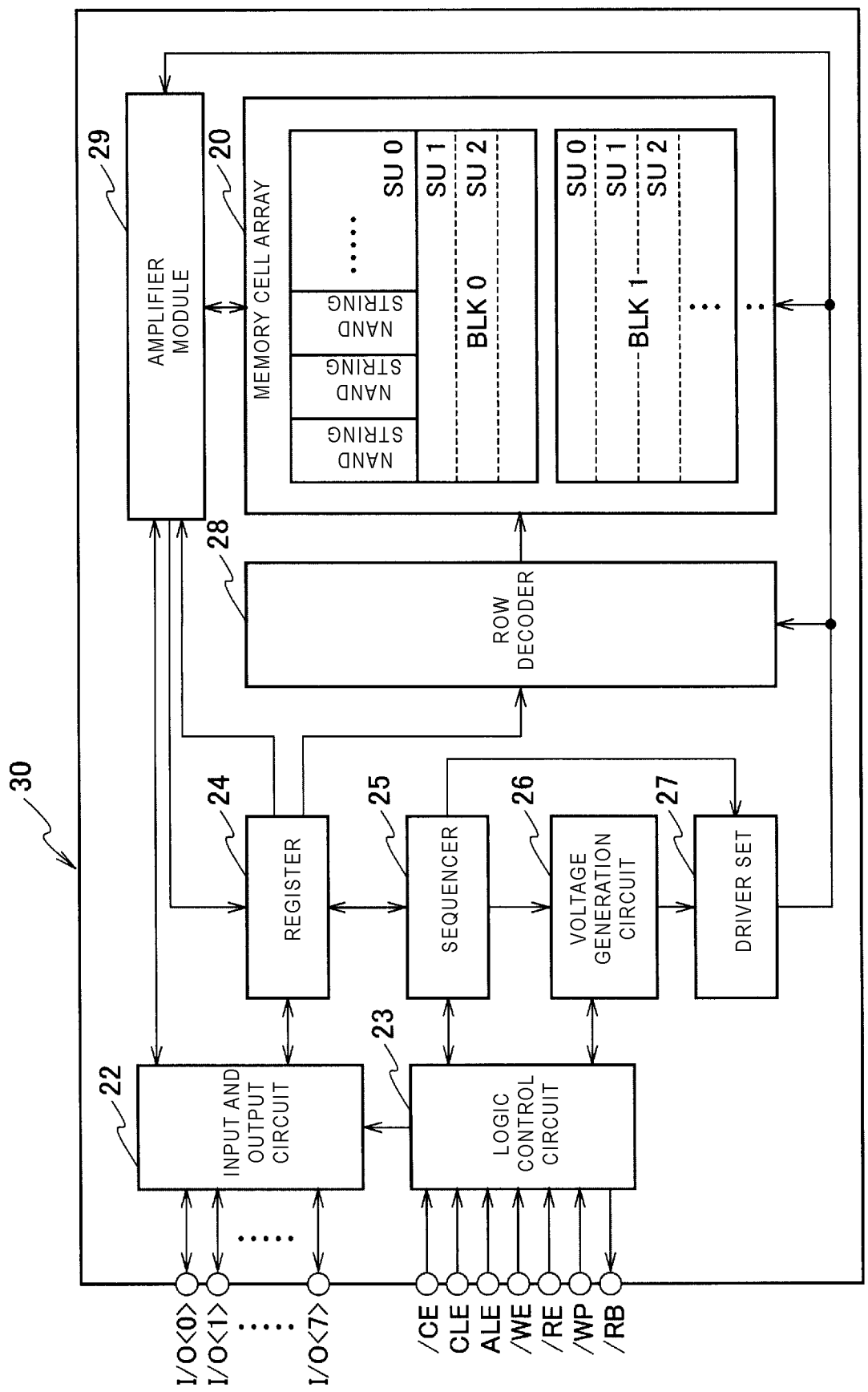
FIG. 18 is a diagram showing a block configuration example of the semiconductor storage device according to the embodiment.

FIG. 18 is a diagram showing a block configuration example of the semiconductor storage device 30 according to the embodiment. The semiconductor storage device 30 includes a memory cell array 20, an input and output circuit 22, a logic control circuit 23, a register 24, a sequencer 25, a voltage generation circuit 26, a driver set 27, a row decoder 28, and a sense amplifier module 29. Here, the memory cell array 20 corresponds to the memory cell array chip 20. Other configurations corresponds to the CMOS chip 10.

The memory cell array 20 includes a plurality of blocks BLK (BLK0, BLK1, . . . ). The blocks BLK each include a plurality of nonvolatile memory cell transistors associated with word lines and bit lines. The block BLK is, for example, a unit of data erasing, and data in the same block BLK is collectively erased. Each block BLK includes a plurality of string units SU (SU0, SU1, SU2, . . . ). Each string unit SU is a set of NAND strings NS. Each NAND string NS includes a plurality of memory cell transistors. Hereinafter, each memory cell transistor is simply referred to as a "cell". The number of blocks in the memory cell array 20, the number of string units in one block BLK, and the number of NAND strings in one string unit SU may be set to any number.

The input and output circuit 22 transmits the signal I/O <7:0> to the controller 8 and receives the signal I/O <7:0> from the controller 8. The input and output circuit 22 transfers the command CMD and the address ADD in the signal I/O <7:0> to the register 24. The input and output circuit 22 transmits and receives the write data and the read data to and from the sense amplifier module 29.

The logic control circuit 23 receives signals /CE, CLE, ALE, /WE, /RE, and /WP from the controller 8. The logic control circuit 23 transfers a signal /RB to the controller 8 and notifies a state of the semiconductor storage device 30 to an outside.

The register 24 stores the command CMD and the address ADD. The register 24 transfers the address ADD to the row decoder 28 and the sense amplifier module 29, and transfers the command CMD to the sequencer 25.

The sequencer 25 receives the command CMD and controls the entire semiconductor storage device 30 according to a sequence based on the received command CMD.

The voltage generation circuit 26 generates a voltage necessary for an operation such as the writing, the reading, and the erasing of the data based on an instruction from the sequencer 25. The voltage generation circuit 26 supplies the generated voltage to the driver set 27.

The driver set 27 includes a plurality of drivers, and supplies various voltages from the voltage generation circuit 26 to the row decoder 28 and the sense amplifier module 29 based on the address from the register 24. The driver set 27 supplies various voltages to the row decoder 28 based on, for example, a row address in the address.

The row decoder 28 receives the row address in the address ADD from the register 24, and selects the block BLK based on a block address in the row address. The voltage from the driver set 27 is transferred to the selected block BLK via the row decoder 28.

When reading the data, the sense amplifier module 29 senses read data read from the memory cell transistor to the bit line, and transfers the sensed read data to the input and output circuit 22. When writing the data, the sense amplifier module 29 transfers write data written via the bit line to the memory cell transistor. The sense amplifier module 29 receives a column address in the address ADD from the register 24, and outputs data of a column based on the column address.

(Circuit Configuration Example of Memory Cell Array)

Figure 19:
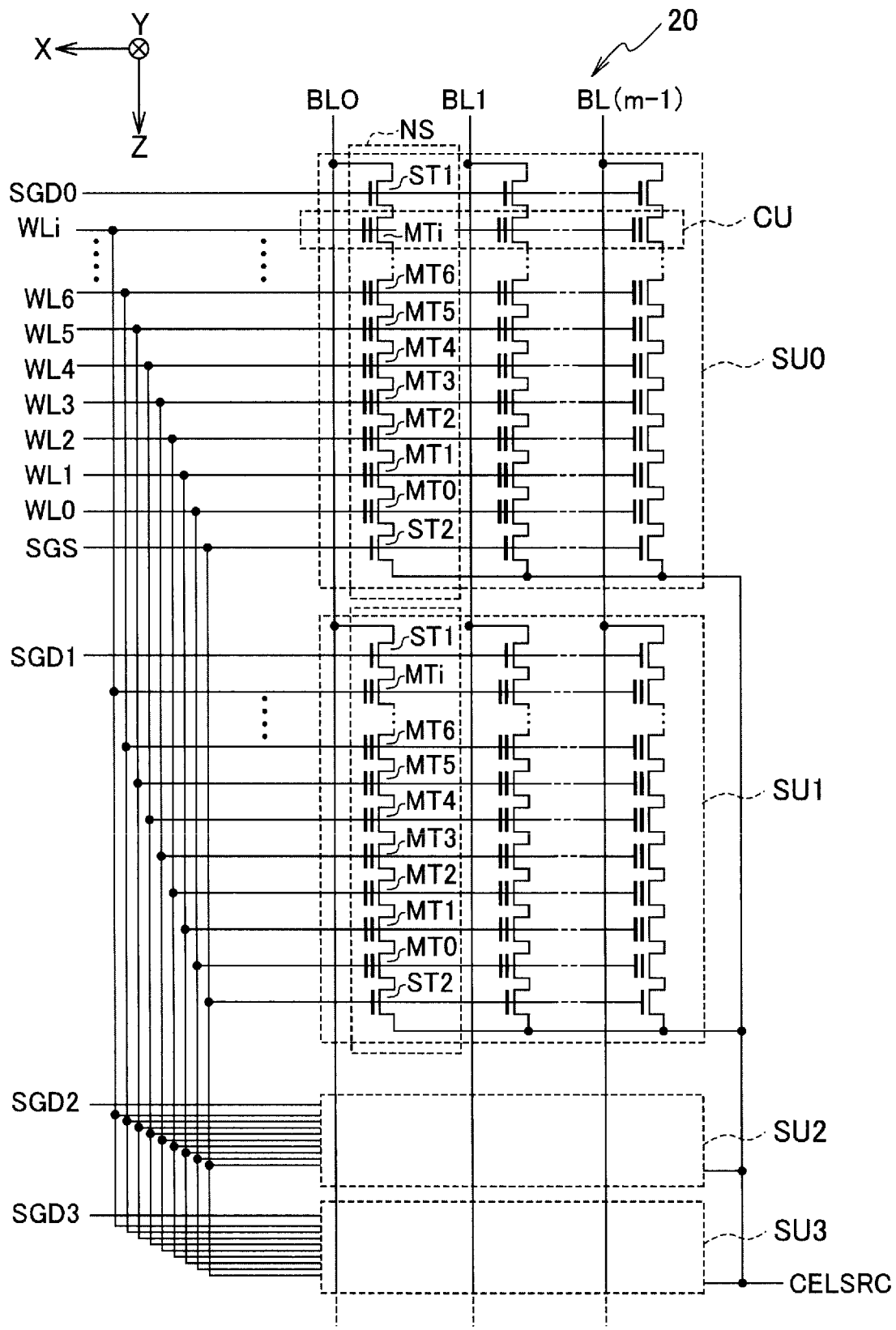
FIG. 19 is a diagram showing a circuit configuration example of the memory cell array of the semiconductor storage device according to the embodiment.

FIG. 19 shows a circuit configuration example of the memory cell array 20 of the semiconductor storage device 30 according to the embodiment. As shown in FIG. 19, each of the NAND strings NS includes, for example, i (i is a natural number) memory cell transistors MT (MT0 to MTi), a select transistor ST1, and a select transistor ST2. The number i of memory cell transistors MT may be, for example, 8, 16, 32, 64, 96, 128, or the like, and the number is not limited. The i (i is a natural number) memory cell transistors MT (MT0 to MTi) may have a two-tier configuration (2-tier). In the two-tier configuration, the memory cell transistors MT (MT0 to MTi) are disposed in the configurations of, for example, MT0 to MT (i/2−1) and MT (i/2) to MTi.

Each memory cell transistor MT is provided with a stacked gate structure including a control gate and a charge storage layer. Each memory cell transistor MT may be provided with a stacked gate structure including a control gate and a floating gate. The memory cell transistors MT are connected in series between the select transistor ST1 and the select transistor ST2.

In one block BLK, gates of the select transistors ST1 in the string units SU0 to SU3 are respectively connected to select gate lines SGD0 to SGD3. Gates of the select transistors ST2 in all of the string units SU in the blocks BLK are commonly connected to a select gate line SGS. Control gates of the memory cell transistors MT0 to MTi in the same block BLK are respectively connected to word lines WL0 to WLi. That is, the word lines WL of the same address are commonly connected to all of the string units SU in the same block BLK, and the select gate line SGS is commonly connected to all of the string units SU in the same block BLK. On the other hand, the select gate line SGD is connected to only one of the string units SU in the same block BLK.

Among the NAND strings NS arranged in a matrix manner in the memory cell array 20, the other end of the select transistor ST1 in NAND strings NS in the same row is connected to one of orbit lines BL (BL0 to BL (m−1) (m is an natural number)). The bit lines BL are commonly connected to NAND strings NS in the same column across a plurality of blocks BLK.

The other end of the select transistor ST2 is connected to a source line CELSRC. The source line CELSRC is commonly connected to a plurality of NAND strings NS across a plurality of blocks BLK.

Data erasing is collectively performed for the memory cell transistors MT in the same block BLK. On the other hand, data reading and writing can be collectively performed for a plurality of memory cell transistors MT commonly connected any one of the word lines WL in any one of the string units SU of any one of the blocks BLK. A set of memory cell transistors MT that share a word line WL in one string unit SU is referred to as a cell unit CU. The cell unit CU is a set of memory cell transistors MT in which a write operation or a read operation can be collectively performed.

One memory cell transistor MT can store, for example, a plurality of pieces of bit data. A set of bits stored by each of the memory cell transistors MT in peer bits in the same cell unit CU is referred to as a "page". A "page" is defined as a memory space formed in a set of memory cell transistors MT in the same cell unit CU.

(Cross-Sectional Structure Example of Memory Cell Array)

Figure 20:
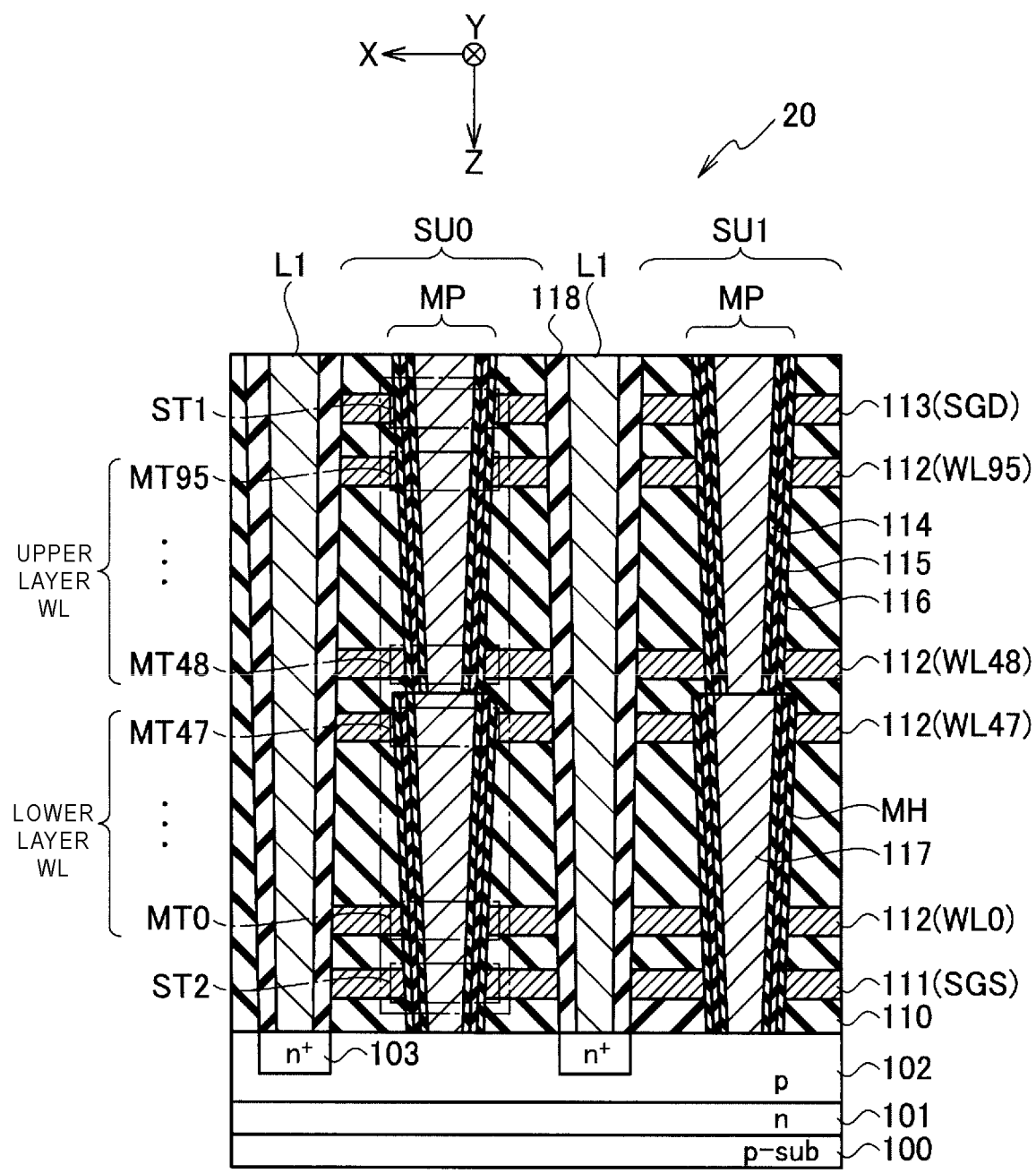
FIG. 20 is a diagram showing a cross-sectional structure example of the memory cell array of the semiconductor storage device according to the embodiment.

FIG. 20 shows a cross-sectional structure example of the memory cell array 20 of the semiconductor storage device 30 according to the embodiment. A cross-sectional configuration of the memory cell array 20 will be described with reference to FIG. 20. The memory cell array 20 is provided on the CMOS chip 10 in a flip chip manner as described in the semiconductor storage device 30 according to the embodiment. A plane parallel to the bonding surface of the CMOS chip 10 is set as the XY plane, and a direction perpendicular to the XY plane is set as the Z direction. The X direction and the Y direction are orthogonal to each other.

FIG. 20 is a cross-sectional view of a source line contacts L1 and the NAND strings of the string units SU0 and SU1 cut in a direction perpendicular to the Y direction in which the word lines WL extend (the X direction parallel to a semiconductor substrate 100). In the example of FIG. 20, for simplification of description, a plurality of NAND strings NS are arranged in a row along the Y direction in each string unit SU. Alternatively, the arrangement of the NAND strings NS in the one string unit SU can be set in any manner. For example, the NAND strings NS may be arranged in two rows in parallel or arranged in a staggered pattern in four rows along the Y direction.

As shown in FIG. 20, an insulating layer 118 is provided on a side surface of each source line contact L1. Also, one string unit SU is disposed between two source line contacts L1 in a manner such that the source line contacts L1 and wiring layers 111, 112, and 113 sandwich the insulating layers 118 and thus are not electrically connected to each other.

In each string unit SU, the NAND strings NS are formed along the Z direction perpendicular to the semiconductor substrate 100. More specifically, a surface region of the semiconductor substrate 100 is provided with an n-type well region 101, and a surface region of the n-type well region 101 is further provided with a p-type well region 102. An $n^{1+}$ type impurity diffusion region 103 is provided on a surface region of the p-type well region 102. Also, on the semiconductor substrate 100, an insulating layer 110 is provided, and the wiring layer 111 that functions as the select gate line SGS, the 96-layer wiring layers 112 that function as the word lines WL0 to WL95, and the wiring layer 113 that functions as the select gate line SGD are sequentially stacked on above the insulating layer 110. Also, insulating layers 110 are provided between the wiring layers 111, 112, and 113, respectively. For the insulating layer 110, for example, a silicon oxide film is used. A plurality of wiring layers 111 and 113 may be provided.

Memory pillars MP that penetrate the wiring layers 111, 112, and 113, and the plurality of insulating layers 110 to reach the p-type well region 102 are provided corresponding to each one NAND string NS. More specifically, the NAND string NS has two memory pillars MP stacked along the Z direction. More specifically, a memory pillar MP1 penetrating the wiring layer 111 corresponding to the select gate line SGS, the wiring layers 112 corresponding to the word lines WL0 to WL47, and a plurality of insulating layers 110 and being connected to the semiconductor substrate 100 is provided. Also, a memory pillar MP2 penetrating the wiring layers 112 corresponding to the word lines WL48 to WL95, the wiring layer 113 corresponding to the select gate line SGD, and a plurality of insulating layers 110 and being connected to an upper surface of the memory pillar MP1 is provided along the Z direction.

In the example of FIG. 20, diameters of the upper surfaces (openings) of the memory pillars MP1 and MP2 are larger than diameters of bottom surfaces thereof. Aside surface of each pillar has an inclination angle of 90 degrees or less relative to a plane of the semiconductor substrate 100 (hereinafter, such a shape is referred to as a "tapered shape"). A shape of each memory pillar MP is not limited to the tapered shape. For example, the memory pillar MP may have a cylindrical shape having the same diameter from the upper surface to the bottom surface, or the diameter of the bottom surface may be larger than the diameter of the upper surface. Further, the structure in which two memory pillars MP are stacked (two-tier configuration (2-tier)) has been described. Alternatively, the structure may be one memory pillar MP, or may be three or more memory pillars MP stacked. Hereinafter, when the memory pillars MP1 and MP2 are not limited, the memory pillars are simply referred to as "memory pillar MP".

A block insulating layer 116, a charge storage layer 115, and a tunnel insulating layer 114 are stacked in the order on the side surface of the memory pillar MP, and an inside of the memory pillar MP is embedded by a semiconductor layer 117. For the block insulating layer 116 and the tunnel insulating layer 114, for example, a silicon oxide film is used. For the charge storage layer 115, for example, a silicon nitride film is used. For the semiconductor layer 117, for example, polycrystalline silicon is used. The semiconductor layer 117 in a memory hole MH is a region where channels are formed when the memory cell transistors MT and the select transistors ST1 and ST2 are turned on.

The memory cell transistors MT0 to MT95 are formed by the memory pillar MP and the word lines WL0 to WL95 (wiring layers 112). Similarly, the memory pillar MP and the select gate lines SGD (wiring layer 113) and SGS (wiring layer 111) form the select transistors ST1 and ST2. The upper surface of the memory pillar MP (MP2) is connected to a bit line BL (not shown). In the present embodiment, the word lines WL0 to WL47 are defined as a lower layer (lower tier) WL group, and a group of the word lines WL48 to WL95 is defined as an upper layer (upper tier) WL group.

Each source line contact L1 has a line shape along the Z direction. For the source line contact L1, for example, polycrystalline silicon is used. Also, a bottom surface of the source line contact L1 is connected to the $n^+$ type impurity diffusion region 103, and an upper surface is connected to a source line SL (not shown). The insulating layer 118 is provided on the side surface of the source line contact L1 in a manner that the source line contact L1 and the wiring layers 111, 112, and 113 are not electrically connected. For the insulating layer 118, for example, a silicon oxide film is used.

Figure 21:
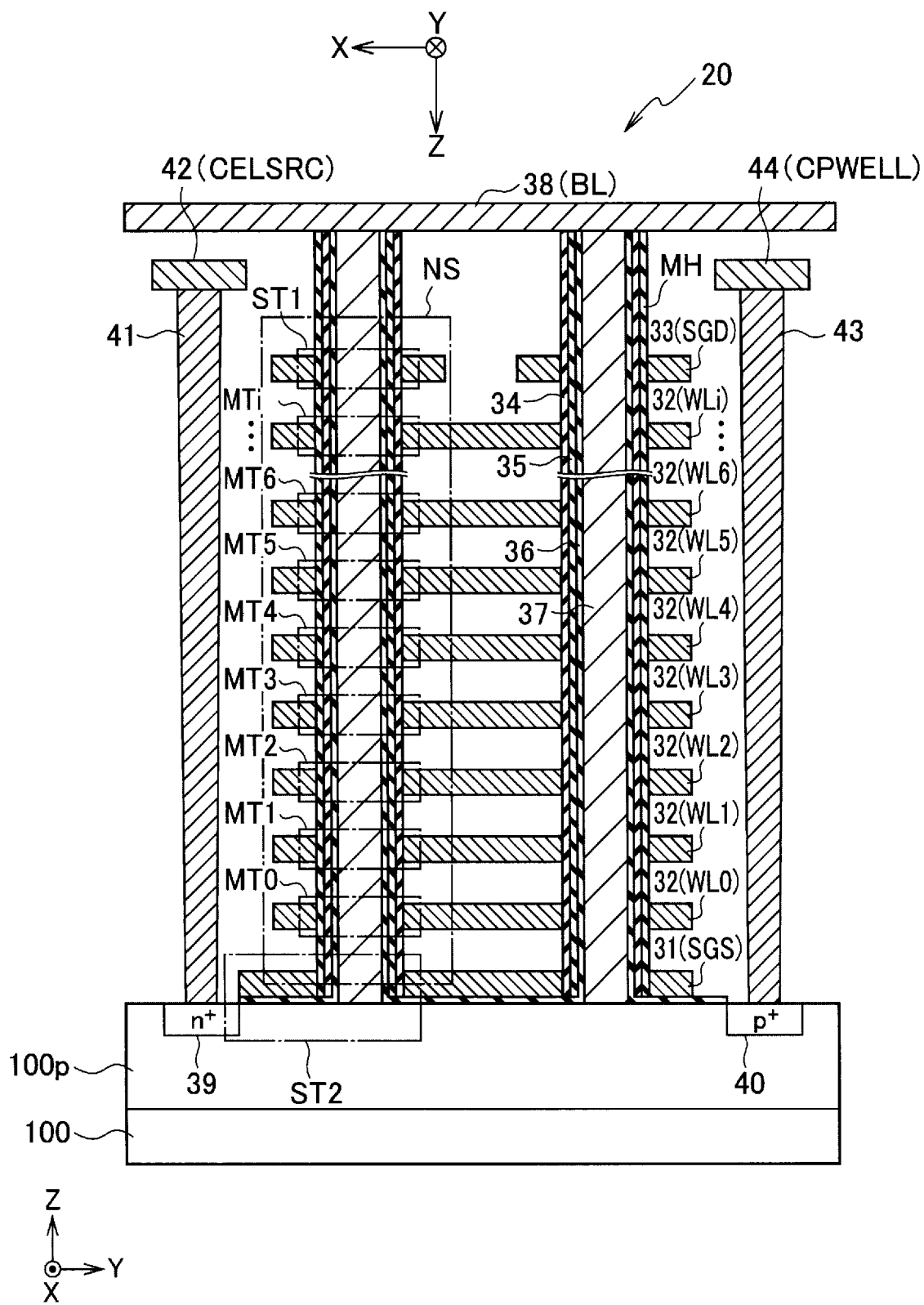
FIG. 21 is a diagram showing another cross-sectional structure example of the memory cell array of the semiconductor storage device according to the embodiment.

FIG. 21 shows another cross-sectional structure example of the memory cell array 20 of the semiconductor storage device 30 according to the embodiment. The memory pillar MP has a cylindrical shape having the same diameter from the upper surface to the bottom surface, and the memory pillar MP has a one tier structure. The memory cell array 20 is provided on the flip chip on the CMOS chip 10. A plane parallel to the bonding surface of the CMOS chip 10 is set as the XY plane, and a direction perpendicular to the XY plane is set as the Z direction. The X direction and the Y direction are orthogonal to each other.

FIG. 21 shows a part relating to two string units SU0 and SU1 in one block BLK. Specifically, FIG. 21 shows each of the two NAND strings NS of the two string units SU0 and SU1 and the peripheral portion thereof. Also, a plurality of NAND string NS configurations shown in FIG. 21 are arranged in the X direction and the Y direction, and for example, a set of a plurality of NAND string NS arranged in the X direction and the Y direction corresponds to one string unit SU.

The memory cell array 20 is provided, for example, on the semiconductor substrate 100. A plane parallel to a surface of the semiconductor substrate 100 is set as the XY plane, and the direction perpendicular to the XY plane is set as the Z direction. The X direction and the Y direction are orthogonal to each other.

A p-type well region 100p is disposed on an upper part of the semiconductor substrate 100. As shown in FIG. 21, a plurality of NAND strings NS are disposed on the p-type well region 100p. That is, for example, a wiring layer 31 that functions as a select gate line SGS, i+1 wiring layers 32 (WL0 to WLi) that function as the word line WL0 to WLi, and a wiring layer 33 that functions as the select gate line SGD are sequentially stacked on the p-type well region 100p. A plurality of wiring layers 31 and 33 may be stacked. An insulating film (not shown) is disposed between each two of the stacked wiring layers 31 to 33.

The wiring layer 31 is commonly connected to, for example, the gate of each select transistor ST2 of a plurality of NAND strings NS in one block BLK. Each wiring layer 32 is commonly connected to the control gate of each memory cell transistor MT of the plurality of NAND strings NS in one block BLK. The wiring layer 33 is commonly connected to the gate of each select transistor ST1 of the plurality of NAND strings NS in one string unit SU.

The memory hole MH passes through the wiring layers 33, 32, and 31, and reaching the p-type well region 100p. A block insulating film 34, a charge storage layer (insulating film) 35, and a tunnel oxide film 36 are arranged in the order from an outer side on a side surface of the memory hole MH. A semiconductor pillar (conductive film) 37 is embedded in the memory hole MH. The semiconductor pillar 37 is, for example, undoped polysilicon, which functions as a current path for the NAND string NS. A wiring layer 38 that functions as a bit line BL is disposed on an upper end of the semiconductor pillar 37.

As described above, the select transistor ST2, the plurality of memory cell transistors MT, and the select transistor ST1 are stacked in the order above the p-type well region 100p, and each memory hole MH corresponds to one NAND string NS.

An $n^+$ type impurity diffusion region 39 and a $p^+$ type impurity diffusion region 40 are disposed in an upper portion of the p-type well region 100p. A contact plug 41 is disposed on the upper surface of the $n^+$ type impurity diffusion region 39. A wiring layer 42 that functions as a source line CELSRC is disposed on an upper surface of the contact plug 41. A contact plug 43 is disposed on an upper surface of the $p^+$ type impurity diffusion region 40. A wiring layer 44 that functions as a well wire CPWELL is disposed on an upper surface of the contact plug 43.

In the above cross-sectional structure example of the 3D memory cell array, an example in which select gate transistors ST1 and ST2 are disposed at both ends of the NAND string NS has been described. A back gate (BG) manner is also applicable, in which the NAND string NS has a U-shaped structure and the select gate transistors ST1 and ST2 are disposed on one side of the NAND string NS.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a first semiconductor chip having a first bonding surface extending along a first direction and a second direction orthogonal to the first direction; and
   a second semiconductor chip having a second bonding surface extending along the first direction and the second direction, the second bonding surface being bonded to the first bonding surface, wherein
   the first semiconductor chip includes a control circuit, a first power line connected to the control circuit and extending in the first direction, and a first pad electrode disposed on the first bonding surface,
   the second semiconductor chip includes a second power line extending in the second direction, a third power line connected to the second power line and extending in the first direction, a second pad electrode connected to the third power line, and a third pad electrode disposed on the second bonding surface, and
   the first power line and the second power line are bonded to each other through the first pad electrode and the third pad electrode, and the first power line is coupled to the second pad electrode via the third power line.

2. The semiconductor storage device according to claim 1, wherein
   the first power line, connected to the control circuit and extending in the first direction, connected to the second power line above the control circuit in a third direction orthogonal to the first direction and the second direction.

3. The semiconductor storage device according to claim 1, wherein
   a terminal portion of the second power line is connected to the second pad electrode.

4. The semiconductor storage device according to claim 1, wherein
   the second pad electrode is disposed on a surface opposite to the second bonding surface.

5. The semiconductor storage device according to claim 1, wherein the first power line is configured to conduct a first current capacity, the second power line is configured to conduct a second current capacity, and the third power line is configured to conduct a third current capacity.

6. The semiconductor storage device according to claim 5, wherein the third current capacity is greater than the second current capacity, and the second current capacity is greater than the first current capacity.

7. The semiconductor storage device according to claim 1, wherein the second semiconductor chip includes a three dimensional memory cell array.

* * * * *